(12) United States Patent
Kuromusha et al.

(10) Patent No.: US 9,705,460 B2
(45) Date of Patent: Jul. 11, 2017

(54) INFORMATION PROCESSING APPARATUS, CONTROL METHOD, AND NON-TRANSITORY COMPUTER READABLE STORAGE MEDIUM

(71) Applicant: Yahoo Japan Corporation, Tokyo (JP)

(72) Inventors: Kenichi Kuromusha, Tokyo (JP); Yoshihito Nishikawa, Tokyo (JP); Yoshio Ikai, Tokyo (JP); Toru Takei, Tokyo (JP); Kazutaka Kimura, Tokyo (JP); Kanta Suzuki, Tokyo (JP)

(73) Assignee: YAHOO JAPAN CORPORATION, Tokyo (JP)

( * ) Notice: Subject to any disclaimer, the term of this patent is extended or adjusted under 35 U.S.C. 154(b) by 4 days.

(21) Appl. No.: 14/844,755

(22) Filed: Sep. 3, 2015

(65) Prior Publication Data

US 2016/0072466 A1  Mar. 10, 2016

(30) Foreign Application Priority Data

Sep. 5, 2014  (JP) ................................. 2014-181711

(51) Int. Cl.
| H03G 3/32 | (2006.01) |
| H03G 3/04 | (2006.01) |

(52) U.S. Cl.
CPC ..................................... *H03G 3/04* (2013.01)

(58) Field of Classification Search
CPC  H03G 3/00; H03G 3/001; H03G 3/04; H03G 3/32; H03G 3/3005; H03G 3/3089
See application file for complete search history.

(56) References Cited

U.S. PATENT DOCUMENTS

| 8,275,135 | B2 * | 9/2012 | Azizi | G10L 21/0208 |
| | | | | 381/104 |
| 8,306,235 | B2 * | 11/2012 | Mahowald | H03G 3/32 |
| | | | | 381/104 |
| 2005/0089177 | A1 * | 4/2005 | Hughes | H03G 3/32 |
| | | | | 381/86 |
| 2007/0033634 | A1 * | 2/2007 | Leurs | H04N 7/163 |
| | | | | 725/143 |
| 2008/0130958 | A1 * | 6/2008 | Ziomek | G06K 9/00825 |
| | | | | 382/116 |
| 2009/0016540 | A1 * | 1/2009 | Heningsen Nielsen | H03G 1/02 |
| | | | | 381/56 |
| 2011/0095875 | A1 * | 4/2011 | Thyssen | G09G 5/10 |
| | | | | 340/407.1 |
| 2013/0343574 | A1 * | 12/2013 | Muthugounder Devarajan | ........ |
| | | | | H03G 3/20 |
| | | | | 381/107 |

FOREIGN PATENT DOCUMENTS

| JP | 2004-062121 A | 2/2004 |
| JP | 2014-110453 A | 6/2014 |

* cited by examiner

*Primary Examiner* — Brenda Bernardi
(74) *Attorney, Agent, or Firm* — Oliff PLC

(57) ABSTRACT

An information processing apparatus includes a learning unit which learns sound level manipulation relating to a sound level of a terminal device used by a user based on information relating to the user. The information processing apparatus includes a determination unit which determines a reproduction mode at the time when the terminal device reproduces an audio contained in a content according to a learning result of the learning unit. The information processing apparatus includes a controller which controls an audio contained in the content in the reproduction mode determined by the determination unit.

17 Claims, 8 Drawing Sheets

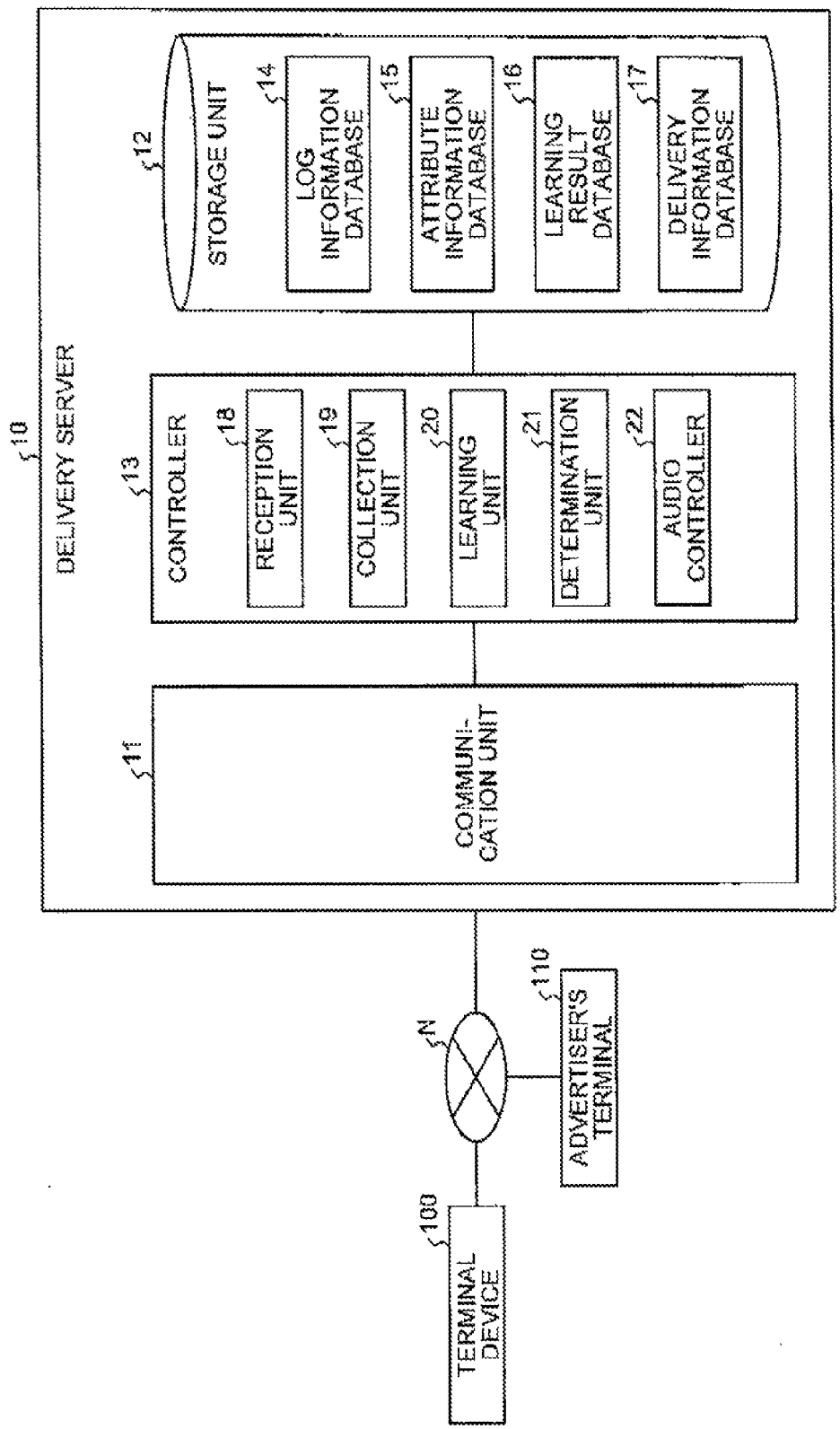

FIG.4

| USER ID | LOG INFORMATION | TIME POINT |
|---|---|---|
| USER A | NETWORK: WIDE AREA NETWORK A | 2014/05/13/20:55 |
| | POSITION: POSITION A | 2014/05/13/21:00 |
| | MANIPULATION: START REPRODUCTION | 2014/05/13/21:01 |
| | MANIPULATION: SOUND LEVEL SETTING (5) | 2014/05/13/21:01 |
| | ⋮ | ⋮ |
| | MANIPULATION: START REPRODUCTION | 2014/05/14/10:01 |
| | MANIPULATION: SOUND LEVEL SETTING (4) | 2014/05/14/10:00 |
| | POSITION: POSITION B | 2014/05/14/10:20 |
| | MANIPULATION: STOP REPRODUCTION | 2014/05/14/11:15 |
| | MANIPULATION: MUTE SETTING | 2014/05/14/11:16 |
| | ⋮ | ⋮ |
| | NETWORK: Wi-Fi NETWORK B | 2014/05/14/12:15 |
| | MANIPULATION: MUTE SETTING | 2014/05/14/12:15 |
| | BROWSING: WEB CONTENT A | 2014/05/14/12:16 |
| | ⋮ | ⋮ |
| | BROWSING: WEB CONTENT B | 2014/05/14/20:55 |
| | FUNCTION: ENTRANCE INTO TICKET GATE | 2014/05/14/21:15 |
| | MANIPULATION: MUTE SETTING | 2014/05/14/21:15 |
| | ⋮ | ⋮ |
| | NETWORK: WIDE AREA NETWORK A | 2014/05/14/22:15 |
| | FUNCTION: EXIT FROM TICKET GATE | 2014/05/14/22:30 |
| | ⋮ | ⋮ |

FIG.5

| USER ID | ATTRIBUTE INFORMATION |
|---|---|
| USER A | GENDER: FEMALE |
| | AGE: IN THIRTIES |
| | JOB: OFFICE WORKER |
| | HOBBY: LISTENING TO MUSIC |
| | ADDRESS: XXXX |
| | ⋮ |

FIG.6

| USER ID | SOUND LEVEL MANIPULATION | TIME ZONE | CONDITION |
|---|---|---|---|
| USER A | SOUND LEVEL MANIPULATION (5) | 21:01 TO 10:01 | |
| | MUTE SETTING | 11:16 TO 11:45 | |
| | SOUND LEVEL MANIPULATION (5) | | START REPRODUCTION |
| | MUTE SETTING | | ENTRANCE INTO TICKET GATE |
| | MUTE SETTING | | Wi-Fi NETWORK B |
| | ⋮ | ⋮ | ⋮ |

FIG.7

| ADVERTISER ID | ADVERTISEMENT CONTENT | NUMBER OF IMPRESSIONS | NUMBER OF GUARANTEED IMPRESSIONS | PRICE | ... |
|---|---|---|---|---|---|
| B10 | C20, REPRODUCTION CONTROL INSTRUCTION | 10000 | 20000 | aaa | ... |
| | C30, REPRODUCTION CONTROL INSTRUCTION | 5000 | 10000 | bbb | ... |
| | C40, REPRODUCTION CONTROL INSTRUCTION | 15000 | 20000 | ccc | ... |
| | ... | ... | ... | ... | ... |
| B20 | C50, REPRODUCTION CONTROL INSTRUCTION | 10000 | 20000 | ddd | ... |
| | C60, REPRODUCTION CONTROL INSTRUCTION | 5000 | 10000 | eee | ... |
| | ... | ... | ... | ... | ... |
| ... | ... | ... | ... | ... | ... |

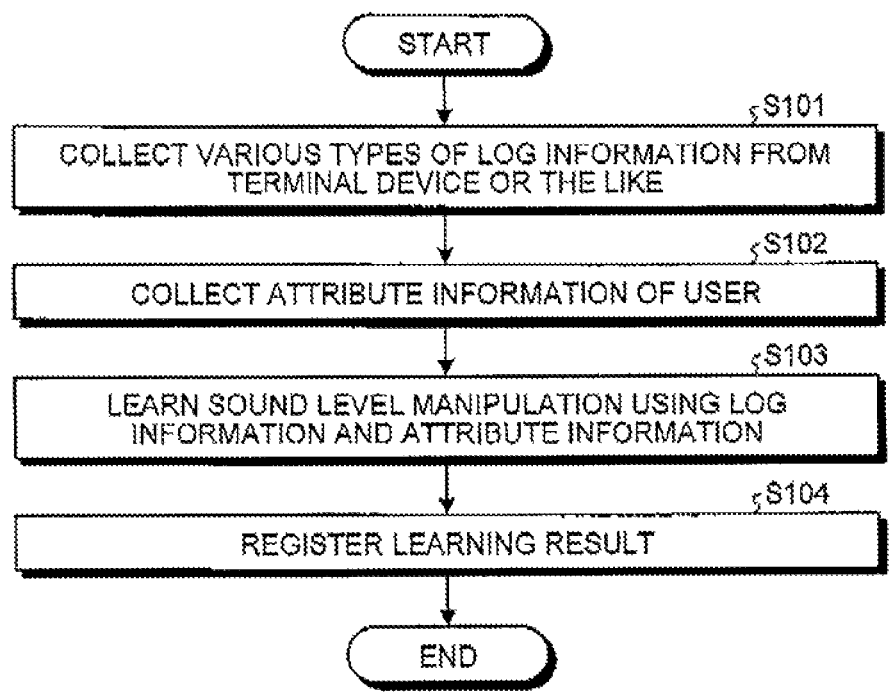

INFORMATION PROCESSING APPARATUS, CONTROL METHOD, AND NON-TRANSITORY COMPUTER READABLE STORAGE MEDIUM

CROSS-REFERENCE TO RELATED APPLICATIONS

The present application claims priority to and incorporates by reference the entire contents of Japanese Patent Application No. 2014-181711 filed in Japan on Sep. 5, 2014.

BACKGROUND OF THE INVENTION

1. Field of the Invention

The present invention relates to an information processing apparatus, a control method, and a non-transitory computer readable storage medium.

2. Description of the Related Art

In recent years, information delivery via the Internet has been actively performed. As an example of the information delivery, there are known techniques for branding using sound by transmitting an audio of sound logo or the like relating to a company, a product, or the like or an audio-added video as an advertisement content to a terminal device of a user and reproducing the audio or video while displaying a web page. In addition, there are known techniques of reproducing an audio only in a case where user's line of sight is directed at the time of reproducing a content or techniques of adjusting a sound level according to a noise in the periphery thereof.

Patent Literature 1: Japanese Patent Application Laid-open No. 2014-110453

Patent Literature 2: Japanese Patent Application Laid-open No. 2004-062121

However, in the conventional techniques, there are some cases where user's convenience cannot be improved. For example, in the conventional techniques, since the content reproduction is only performed at a predetermined sound level when the user's line of sight is directed, in a case where the user forgets to set the sound level to a mute state, there is a possibility that the audio is output in an electric train or the like.

SUMMARY OF THE INVENTION

It is an object of the present invention to at least partially solve the problems in the conventional technology.

According to one aspect of an embodiment, an information processing apparatus includes a learning unit which learns sound level manipulation relating to a sound level of a terminal device used by a user based on information relating to the user. The information processing apparatus includes a determination unit which determines a reproduction mode at the time when the terminal device reproduces an audio contained in a content according to a learning result of the learning unit. The information processing apparatus includes a controller which controls an audio contained in the content in the reproduction mode determined by the determination unit.

According to the other aspect of an embodiment, an information processing apparatus includes a determination unit which specifies sound level manipulation corresponding to a situation of a user at the time of delivery request for a content from a model of the sound level manipulation relating to a sound level of a terminal device used by the user which is learned based on information relating to the user and determines a reproduction mode at the time when the terminal device reproduces an audio contained in the content according to the specified sound level manipulation. The information processing apparatus includes a controller which controls the audio contained in the content in the reproduction mode determined by the determination unit.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 3 is a diagram illustrating an example of a configuration of a delivery server according to the embodiment;

FIG. 4 is a diagram illustrating an example of a log information database according to the embodiment;

FIG. 5 is a diagram illustrating an example of an attribute information database according to the embodiment;

FIG. 6 is a diagram illustrating an example of a learning result database according to the embodiment;

FIG. 7 is a diagram illustrating an example of information stored in a delivery information database according to the embodiment;

FIG. 8 is a flowchart illustrating an example of a learning process performed by the delivery server according to the embodiment;

DETAILED DESCRIPTION OF THE PREFERRED EMBODIMENTS

Figure 1:
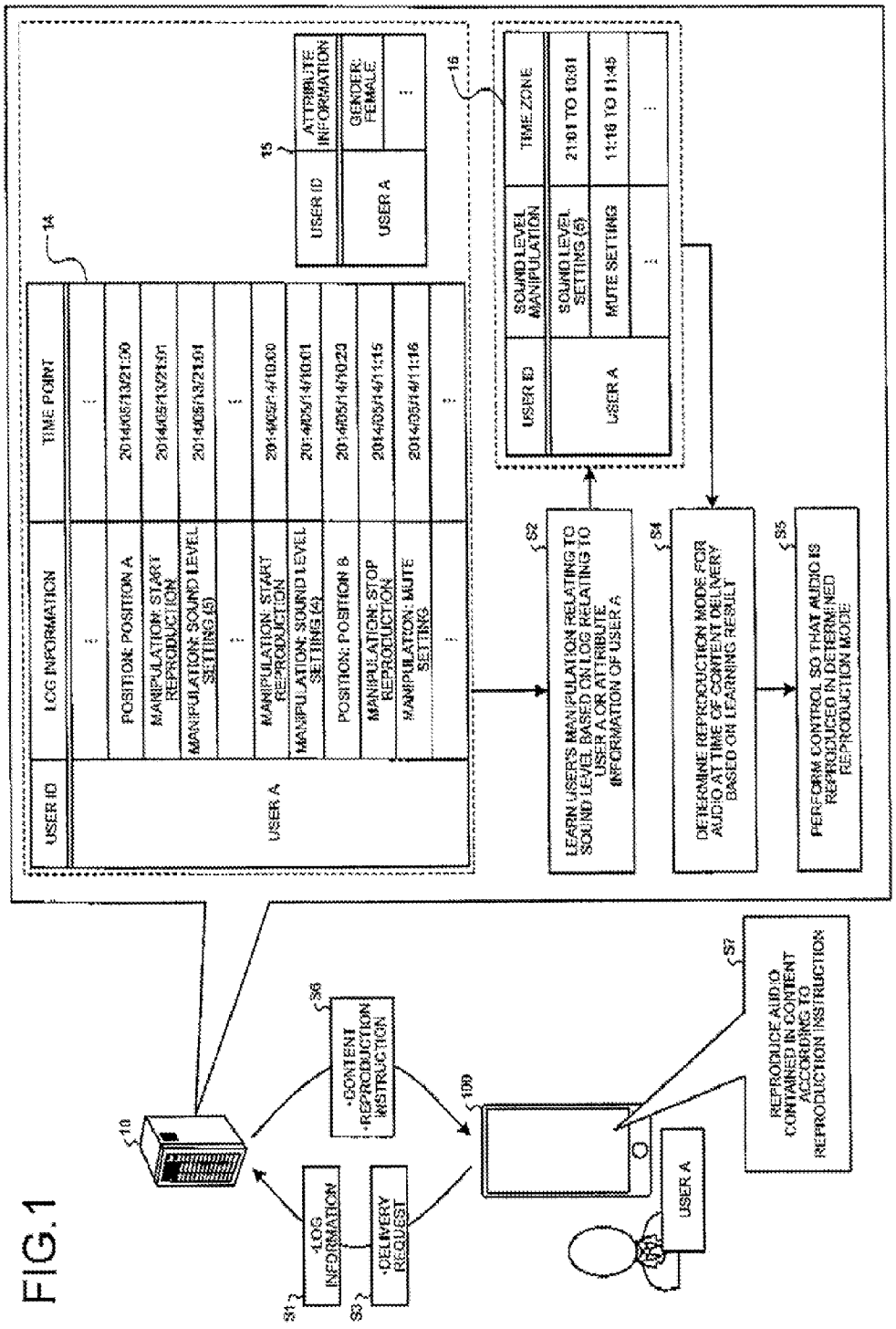
FIG. 1 is a diagram illustrating an example of a delivery server according to an embodiment.

Hereinafter, embodiments for embodying an information processing apparatus, a control method, and a control program according to the invention (hereinafter, referred to as "embodiments") will be described in detail with reference to the drawings. In addition, the information processing apparatus, the control method, and the control program according to the invention are not limited by the embodiments. In addition, in the embodiments described hereinafter, the same components are denoted by the same reference numerals, and the redundant description thereof is omitted.

1. Example of Delivery Server

First, an example of a delivery server as an example of an information processing apparatus according to an embodiment will be described with reference to FIG. 1. FIG. 1 is a diagram illustrating an example of the delivery server according to the embodiment. In addition, in the description hereinafter, illustrated is an example of processes where a collection process of collecting information on a user A, a determination process of determining a reproduction mode at the time when a terminal device 100 reproduces audio contained in a content by using the information on the user A of the terminal device 100, and a control process of performing control of the audio contained in the content in the reproduction mode determined by the determination process are performed by a delivery server 10 as an example of a delivery apparatus.

In addition, in the example illustrated in FIG. 1, an example of the user of the terminal device 100 is denoted by the user A. However, the embodiment is not limited thereto, but the information processing apparatus can perform the collection process, the determination process, and the control process with respect to an arbitrary number of terminal devices and an arbitrary number of users.

In addition, in the description hereinafter, described is an example of a process of controlling a sound level performed by the delivery server 10 at the time when the terminal device 100 reproduces a content relating to advertisement. However, the embodiment is not limited thereto, but the process described below can be applied to any audio-containing content, that is, an arbitrary content such as a content containing only audio and a video content of a movie.

In addition, the content may be advertisement, recruitment of volunteers, public campaign advertisement, notice to the public, and other arbitrary contents. Namely, if the content draws user's interest to widely notify information contained in the content or information contained in a content (for example, a landing page or the like) relating to the content, characters, figures, symbols, hyperlinks, or other arbitrary contents can be employed.

In addition, the content may contain an arbitrary audio, that is, a sound logo recalling an audio trade mark or the like, a company, or an advertisement target product. In addition, the content may contain voice of a language produced by a human or a voice synthesis technique, that is, narration. In addition, the content may contain background sound such as BGM which decorates or assists other audios or effect sound which is output when the user performs manipulation or operates on the content. In addition, the content is not limited to the video containing audio, but for example, an arbitrary audio-containing content such as a combination of audio and still images or a game or an arbitrary audio-containing content such as a live video can be employed. In addition, the content may be a video content posted by the user or a free-of-charge or paid content of a movie or an animation.

The delivery server 10 is an information processing apparatus such as a web server of performing delivery of an audio-containing content to the terminal device 100. For example, if the delivery server 10 receives a delivery request for a content from the terminal device 100 used by the user A via a network N such as the Internet, the delivery server transmits the content of an audio-containing video to the terminal device 100.

The terminal device 100 is a smart device such as a smart phone or a tablet and a mobile terminal device capable of communicating with an arbitrary server apparatus via a radio communication network such as 3G (generation) or LTE (long term evolution). In addition, as described below, the terminal device 100 includes a display plane such as a liquid crystal display. In addition, it is assumed that the terminal device 100 employs a touch panel. Namely, the user of the terminal device 100 performs various types of manipulation by touching a display plane with a finger or a dedicated pen.

In addition, the terminal device 100 may be an information processing apparatus such as a desktop PC (personal computer), a notebook PC, a net book, or a server apparatus. In addition, the terminal device 100 may have a function of displaying information on another information display device instead of a screen installed in the terminal device 100. In addition, the terminal device 100 may receive various types of manipulation through an information input device such as a mouse or a keyboard.

Herein, in a case where the terminal device 100 is to display a web content such as a web page according to user's manipulation, the terminal device transmits a delivery request for the web content to a server which performs delivery of the web content. In this case, if the terminal device 100 receives the delivery of the web content, the terminal device transmits a delivery request for a content such as a video arranged in the web content to the delivery server 10.

In this case, the delivery server 10 delivers the content to the terminal device 100. Next, the terminal device 100 arranges the content received from the delivery server 10 in the web page and performs reproduction of the content according to a predetermined condition. For example, in a case where the user performs content selecting manipulation such as tapping a displayed content or matching a position of a cursor with a display position of a content or in a case where a predetermined area of thumbnails of the content is displayed in a screen, the terminal device 100 performs reproduction of the content. Namely, the terminal device 100 outputs the audio data contained in the content and performs the reproduction of the video contained in the content. In addition, in a case where the user performs content selecting manipulation during reproduction of the content or in a case where a predetermined area of the content is moved outside the screen, the terminal device 100 temporarily stops the reproduction of the content.

2. Process Performed by Delivery Server 10

Herein, in the related art, in a case where the terminal device 100 performs the reproduction of an audio-containing content such as a video content or an audio content, the terminal device performs the reproduction of the audio according to a sound level set in advance by the user. For example, the terminal device 100 senses user's line of sight through an image analysis or the like, and only in a case where user's line of sight is directed into the screen, the terminal device performs the reproduction of the audio with the sound level set in advance by the user. In addition, in a case where a noise in the periphery thereof is higher than a predetermined threshold value, the terminal device 100 performs the reproduction of the audio with a predetermined sound level.

However, in the related art described above, there are some cases where user's convenience is deteriorated. For example, in the related art, in a case where the user does not set the sound level to a mute state, there is a case where an audio may be output inside an electric train, a public place, or the like. In addition, in a terminal device where a sound level of an incoming call period or the like and a sound level of a content reproduction time period are individually set, although the user sets the sound level of the incoming call period or the like to a mute state, there is a case where an audio is output at the time of the content reproduction time period.

In addition, in a case where an audio-containing video content is arranged on a web page and the video content is displayed in a screen, techniques of automatically starting reproduction of the video content or techniques of reproducing an audio at the same time of displaying the web page are increased. In the related art, it is expected that a number of times of that events of reproducing an audio due to an inappropriate situation are increased.

Therefore, the delivery server 10 performs the following processes. First, the delivery server 10 collects the information on the user A using the terminal device 100 and a learning process of learning sound level manipulation relating to a sound level of the terminal device 100 used by the user A based on the collected information on the user A. In addition, according to a learning result of the learning process, the delivery server 10 performs a determination process of determining a reproduction mode at the time when the terminal device 100 reproduces the audio contained in the content. Next, the delivery server 10 performs a control process of controlling the audio contained in the content in the reproduction mode determined by the determination process.

2-1. Information on User A

Herein, an example of the information on the user A used in the learning process by the delivery server 10 will be described. The delivery server 10 collects, as the information on the user A, attribute information indicating attributes of the user A or arbitrary log information associated with the user A. For example, the log information includes log information which the information processing apparatus such as the terminal device 100 or a wearable device used by the user A can acquire and other arbitrary log associated with the user A as log collected by an arbitrary server. As a specific example, the log information includes log indicating a history of sites of searching or browsing performed on the web by the user, log indicating a fact indicating that data request for an arbitrary product is performed, and log indicating a history of remarks carried out on bulletin boards on the web or web blogs, or the like. Namely, the log information includes a history of behaviors of the user A which can be acquired through the Internet, information which is input through the Internet by the user A, or any arbitrary information which can be acquired.

In addition, the log information may include log indicating a history of positions acquired by the terminal device 100 or a wearable device or the like used by the user A using a GPS (global positioning system), an iBeacon, or the like, a history of use of credit carts of the user, bank accounts on the web, and the like, a history of products purchased by the user, or the like. Namely, the log information may include a history of behaviors of the user in a real world, so-called, life log.

In addition, the log information may include log relating to manipulation on the terminal device 100, log of sound level manipulation of manipulating a sound level of the terminal device 100, log relating to physical states of the terminal device 100 acquired by various sensors included in the terminal device 100 such as a slope of the terminal device 100, log indicating a history of use of functions of the terminal device 100 such as FeliCa (registered trade mark), log indicating networks which the terminal device 100 accesses, log indicating a history of communication of the terminal device 100 with terminal devices in the periphery thereof performed via a near field communication or the Internet, and log indicating a history of arbitrary functions included in the terminal device 100, that is, log information in the terminal device 100 such as types, details, or the like of the web content which the terminal device 100 displays.

In addition, the attribute information may include arbitrary information on the user A or relating to the user A such as age, gender, income, or a family structure which the user A registers in advance. In addition, the attribute information may include attribute information indicating users which are estimated from the log information, the history of use of credit cards, the bank accounts, and the like, the history of point grant or use, the history of the products purchased by the user A, and registered attribute information.

In this manner, the delivery server 10 collects arbitrary information relating to the user A as the information on the user A. In addition, the delivery server 10 may acquire the information on the user A according to an arbitrary method. For example, the delivery server 10 may acquire the aforementioned various types of information from the terminal device 100 or arbitrary servers which the terminal device 100 accesses based on HTTP cookies (hyper text transfer protocol cookies). In addition, for example, the delivery server 10 may acquire the aforementioned information from the log server which collects the information on the user A or other arbitrary servers.

2-2. Learning Process

Subsequently, an example of the learning process performed by the delivery server 10 will be described. If the delivery server 10 collects the user information, the delivery server performs the learning process of learning the sound level manipulation which is manipulation relating to the sound level of the terminal device 100 based on the collected user information. More specifically, the delivery server 10 learns a pattern of the sound level manipulation on the terminal device 100 based on the collected log information or the collected attribute information. For example, the delivery server 10 extracts manipulation of increasing the sound level based on the log information, manipulation of decreasing the sound level based on the log information, manipulation of muting the sound based on the log information, manipulation of designating a setting value of the sound level based on the log information, and the sound level manipulation of the information indicating the setting value of the sound level or the like. Namely, the sound level manipulation has a concept including not only the manipulation of setting the sound level but also the setting value itself of the sound level.

Therefore, the delivery server 10 performs learning of a time point when the extracted sound level manipulation is performed, a commonality of the log information which is acquired before and after the sound level manipulation, a periodicity of increase, decrease, and muting of the sound level, and a coincidence between the sound level manipulation and an arbitrary condition in the terminal device 100 from properties or the like of the user which is expected from the attribute information. As a result, the delivery server 10 generates a learning result in association of a predetermined condition based on the time point, the position, the manipulation on the terminal device 100, the use of the functions included in the terminal device 100, and the properties of the user which is expected from the attribute information of the user with sound manipulation performed in the state where the condition is satisfied.

Hereinafter, an example of the learning process performed by the delivery server 10 will be described. For example, the delivery server 10 specifies the situation of the terminal device 100 and the sound level manipulation based on the acquired information on the user A and performs learning in association of the specified situation of the terminal device 100 with the sound level manipulation in the situation. As a specific example, the delivery server 10 specifies the situation of the user A such as a state where the user A is lying or a state where the user A is sitting based on the log information indicating a slope of the terminal device 100 and the log information indicating the manipulation on the terminal device 100 and learns the sound level manipulation in the specified situation. In addition, the situation of the user A is a situation where the user A is lying and may be biometric information of the user A, geographical information of the user A, information of peripheries of the user A, or the like such as a posture or blood pressure of the user A, a position of the user A, a vehicle in which the user A is getting, or a level of noise in the periphery of the user A.

Next, the delivery server 10 produces the learning result in association of the situation of the user A with the sound level manipulation learned for each situation. In addition, beside the aforementioned example, the delivery server 10 may perform learning of the sound level manipulation for every arbitrary state if the state is a state of the user A which can be specified based on the log information or the attribute information.

In addition, in another example, the delivery server 10 specifies the manipulation on the terminal device 100 and the sound level manipulation based on the acquired information on the user A and performs learning in association of the specified manipulation on the terminal device 100 with the specified sound level manipulation. As a specific example, the delivery server 10 specifies starting of an application of communication history, a game, a media player, or a messenger in the terminal device 100 or other arbitrary manipulation and learns the sound level manipulation at the time when the above manipulation is performed or the sound level manipulation which is performed before and after the above manipulation is performed. Next, the delivery server 10 produces the learning result in association of the specified manipulation with the sound level manipulation learned for every manipulation. In addition, the delivery server 10 may learn the sound level manipulation for every combination of a plurality of the manipulation, for example, the sound level manipulation at the time when a first manipulation is performed and, after that, a second manipulation is performed.

In addition, in still another example, the delivery server 10 specifies the position of the user A and the sound level manipulation based on the acquired information on the user A and performs learning in association of the specified position with the specified sound level manipulation. As a specific example, the delivery server 10 specifies the position of the terminal device 100 and the position of the user A based on the log information and learns the sound level manipulation at the specified position. Next, the delivery server 10 produces the learning result in association of the specified position with the sound level manipulation learned for every position. In addition, the delivery server 10 may learn the sound level manipulation for every apparatus which acquires the log information relating to the position.

In addition, in further still another example, the delivery server 10 specifies the network which the terminal device 100 accesses and the sound level manipulation based on the acquired information on the user A and performs learning in association of the specified network with the sound level manipulation at the time when the terminal device 100 accesses the network. As a specific example, the delivery server 10 specifies the network which the terminal device 100 accesses such as an access point or a Wi-Fi network which the terminal device accesses at the time when the terminal device 100 accesses a wide area network, an IP (internet protocol) address of a gateway server at the time when the terminal device 100 accesses the network N based on the log information. In addition, the delivery server 10 learns the sound level manipulation at the time when the terminal device accesses the specified network. Next, the delivery server 10 produces the learning result in association of the network with the sound level manipulation learned for every network.

In addition, in further still another example, the delivery server 10 specifies the history of entrance and exit using the terminal device 100 and the sound level manipulation and performs learning in association of the specified history of entrance and exit with the specified sound level manipulation. For example, the delivery server 10 specifies a history of entrance and exit through ticket gates of stations, getting-in or getting-off at public transportation such as buses, entrance and exit with respect to facilities such as buildings based on a history of use of a non-contact-type communication function such as FeliCa (registered trade mark) embedded in the terminal device 100. In addition, the delivery server 10 learns the sound level manipulation for every specified history of entrance and exit. Next, the delivery server 10 produces the learning result in association of the sound level manipulation learned for every history of entrance and exit or the like with the history of entrance and exit or the like. For example, the delivery server 10 learns the sound level manipulation performed before and after the time when the user enters the ticket gate of the station by using the function such as FeliCa (registered trade mark) and produces the learning result in association of the fact that the user enters the ticket gate of the station with the learned sound level manipulation.

In addition, besides the above-described learning processes, the delivery server 10 may perform learning in association of an arbitrary condition with the sound level manipulation in the condition. For example, the delivery server 10 may learn the sound level manipulation for every predetermined time zone. In addition, the delivery server 10 may learn the sound level manipulation in association with, for example, a history of use of the terminal device 100, a content which the terminal device 100 reproduces, a web page which the terminal device 100 displays, a physical state of the terminal device 100, a sound level in a different terminal device positioned in the periphery of the terminal device 100, or the like. Namely, the delivery server 10 may learn the sound level manipulation for every arbitrary condition relating to the terminal device 100 or the user A.

2-3. Determination Process

Subsequently, an example of the determination process performed by the delivery server 10 will be described. For example, in a case where the delivery server 10 receives the delivery request for the content, the delivery server determines the reproduction mode at the time when the terminal device reproduces the audio contained in the content according to the learning result learned as a result of the learning process. More specifically, if the delivery server 10 receives the delivery request for the content, the delivery server specifies the condition such as a state or the like of the terminal device 100 or the user A at the time when the content is delivered by using the information on the user A. Next, the delivery server 10 specifies the sound level manipulation associated with the specified state based on the learning result and determines the reproduction mode at the time when the terminal device reproduces the audio contained in the content according to the specified sound level manipulation.

For example, if the delivery server 10 receives the delivery request for the content, the delivery server specifies the information on the user A acquired within a predetermined time period from the time of receiving the delivery request and specifies the situation of the terminal device 100 based on the specified information on the user A. Next, the delivery server 10 specifies the sound level manipulation associated with the specified situation of the terminal device 100 based on the learning result and determines the reproduction mode based on the specified learning result. For example, the delivery server 10 specifies the sound level of the terminal device 100 indicated by the specified sound level manipulation and determines the reproduction mode of reproducing the audio in the content at the specified sound level.

In addition, in another example, the delivery server 10 specifies the manipulation on the terminal device 100 performed within a predetermined time period from the time of receiving the delivery request. Next, the delivery server 10 specifies the sound level manipulation associated with the specified manipulation on the terminal device 100 based on the learning result and determines the reproduction mode based on the specified learning result.

In addition, in still another example, the delivery server 10 specifies the position of the user A within a predetermined time period from the time of receiving the delivery request. Next, the delivery server 10 specifies the sound level manipulation associated with the specified position of the user A based on the learning result and determines the reproduction mode based on the specified learning result.

In addition, in further still another example, the delivery server 10 specifies the network which the terminal device 100 accesses at the time of receiving the delivery request. Next, the delivery server 10 specifies the sound level manipulation associated with the specified network which the terminal device 100 accesses based on the learning result and determines the reproduction mode based on the specified learning result.

In addition, in further still another example, the delivery server 10 specifies the history of entrance and exit using the terminal device 100 performed within a predetermined time period from the time of receiving the delivery request. Next, the delivery server 10 specifies the sound level manipulation associated with the specified history of entrance and exit using the terminal device 100 based on the learning result and determines the reproduction mode based on the specified learning result.

In addition, besides the above-described learning processes, with respect to an arbitrary condition relating to the terminal device 100 or the user A at the time of receiving the delivery request for the content, the delivery server 10 may determine the reproduction mode according to the sound level manipulation learned in association with the condition. For example, the delivery server 10 may specify, as the condition at the time of receiving the delivery request, a history of use of the terminal device 100, a content which the terminal device 100 reproduces, a web page which the terminal device 100 displays, a physical state of the terminal device 100, a sound level in a different terminal device positioned in the periphery of the terminal device 100, or the like and determine the reproduction mode according to the sound level manipulation associated with the specified condition. In addition, the delivery server 10 may determine the reproduction mode according to the sound level manipulation associated with a time zone including the time point of receiving the delivery request.

2-4. Control Process

Next, the control process performed by the delivery server 10 will be described. For example, in a case where the reproduction mode is determined by the determination process, the delivery server 10 performs the control process of controlling the audio contained in the content in the determined reproduction mode. As a specific example, the delivery server 10 generates a reproduction instruction of allowing the terminal device 100 to reproduce the audio contained in the content in the determined reproduction mode. Next, the delivery server 10 transmits the generated reproduction instruction and the content to the terminal device 100. As a result, the terminal device 100 reproduces the audio contained in the received content in accordance with the reproduction instruction. For example, the terminal device 100 reproduces the audio in the received content at the sound level indicated by the reproduction instruction.

In addition, in another example, the delivery server 10 may edit the audio contained in the content so that the audio is reproduced in the determined reproduction mode when the terminal device 100 performs reproducing of the content and transmit the content where the audio is edited to the terminal device 100. For example, the delivery server 10 may adjust the audio in the received content to the sound level indicated by the reproduction instruction and transmit the content where the sound level is adjusted to the terminal device 100.

2-5. Example of Processes Performed by Delivery Server

Next, an example of the selection process performed by the delivery server 10 will be described with reference to FIG. 1. In addition, in the description hereinafter, described is an example where the delivery server 10 learns the sound level manipulation in association with the time zone and determines the reproduction mode according to the sound level manipulation associated with the time point when the delivery request for the content is received. In addition, in the description hereinafter, described is an example where the delivery server 10 receives, as the sound level manipulation, log information indicating after-setting sound levels as 6 steps of "0" to "5" or log information of setting the sound level to "0". In addition, it is assumed that the sound level "0" indicates a mute state and the sound level "5" indicates a maximum sound level.

First, a log information database 14 included in the delivery server 10 will be described. The log information collected by the delivery server 10, the user ID identifying the user, and the time point when the log information is acquired in correspondence to each other are registered in the log information database 14.

For example, in the example illustrated in FIG. 1, an entry associated with the log information "position: position A" indicating the position and the time point "2014/05/13/21:00" in correspondence with the user ID "user A" identifying the user A is registered in the log information database 14. Namely, the log information indicating the fact that the user A is positioned at the "position A" at the time point "2014/05/13/21:00" is registered in the log information database 14.

In addition, in the example illustrated in FIG. 1, the user ID "user A", the log information "manipulation: start reproduction" indicating the manipulation on the terminal device 100, and the time point "2014/05/13/21:01" in correspondence to each other are registered in the log information database 14. Namely, the log information indicating the fact that the user A performs the manipulation "start reproduction" of instructing the reproduction of a predetermined content on the terminal device 100 at the time point "2014/05/13/21:01" is registered in the log information database 14.

In addition, in the example illustrated in FIG. 1, the user ID "user A", the log information "manipulation: sound level setting (5)" indicating the sound level manipulation, and the time point "2014/05/13/21:01" in correspondence to each other are registered in the log information database 14. Namely the log information indicating the fact that the user A performs the sound level manipulation of setting the sound level to "5" on the terminal device 100 at the time point "2014/05/13/21:01" is registered in the log information database 14. In addition, in the example illustrated in FIG. 1, the log information "manipulation: stop reproduction" indicating the manipulation of stopping the reproduction of the content or the log information "manipulation: mute setting" indicating the sound level manipulation of setting the sound level to a mute state in correspondence to the user ID and the time point is registered in the log information database 14.

Subsequently, an attribute information database 15 included in the delivery server 10 will be described. The attribute information of the user which the delivery server 10 collects in advance is registered in the attribute information database 15. For example, the user ID "user A" and the attribute information "gender: female" indicating the fact that the user A is female in correspondence to each other are registered in the attribute information database 15.

Subsequently, a learning result database 16 included in the delivery server 10 will be described. As learning results generated as the results of the learning process, the user ID, the sound level manipulation, and the time zone in correspondence to each other are registered in the learning result database 16. For example, in the example illustrated in FIG. 1, the user ID "user A", the sound level manipulation "sound level setting (5)", and the time zone "21:01 to 10:01" in correspondence to each other are registered. In addition, in the example illustrated in FIG. 1, the user ID "user A", the sound level manipulation "mute setting", and the time zone "11:16 to 11:45" in correspondence to each other are registered.

Subsequently, an example of the processes performed by the delivery server 10 will be described. First, the delivery server 10 collects the log information from the terminal device 100 and registers the collected log information in the log information database 14 (step S1). For example, the delivery server 10 stores the user ID identifying the user relating to the log information, the log information, and the time point when the terminal device 100 acquires the log information in correspondence to each other in the log information database 14.

Subsequently, the delivery server 10 performs the learning process of learning the sound level manipulation based on the log information relating to the user A or the attribute information of the user A (step S2). For example, the delivery server 10 extracts the log information and the time point relating to the sound level manipulation from the log information in correspondence to the user ID "user A". Subsequently, the delivery server 10 specifies the time zone from the time when the sound level manipulation is performed to the time when the next sound level manipulation is performed. Next, the delivery server 10 registers the user ID "user A", the sound level manipulation, and the time zone from the time when the sound level manipulation is performed to the time when the next sound level manipulation is performed in correspondence to each other in the learning result database 16.

For example, the delivery server 10 specifies the time zone "21:01 to 10:01" from the time point "21:01" when the sound level manipulation "manipulation: sound level setting (5)" is performed to the time point "10:01" when the sound level manipulation "manipulation: sound level setting (4)" is performed. Next, the delivery server 10 registers the learning result in correspondence to the specified time zone "21:01 to 10:01" and the sound level manipulation "sound level setting (5)" in the learning result database 16. In addition, the delivery server 10 specifies the time zone "11:16 to 11:45" from the time point "11:16" when the sound level manipulation "manipulation: mute setting" is performed to the time point, for example, "11:45" when the next sound level manipulation is performed. Next, the delivery server 10 registers the learning result in correspondence to the specified time zone "11:16 to 11:45" and the sound level manipulation "mute setting" in the learning result database 16.

Subsequently, the delivery server 10 receives the delivery request for the content from the terminal device 100 (step S3). In this case, the delivery server 10 performs the determination process of determining the reproduction mode of reproducing the audio contained in the content based on the learning result (step S4). For example, in a case where the time point of receiving the delivery request is "11:20", the delivery server 10 specifies the sound level manipulation "mute setting" in correspondence to the time zone "11:16 to 11:45" including the time point. As a result, the delivery server 10 determines the reproduction mode of reproducing the audio contained in the content in a mute state.

In addition, in another example, in a case where the time point of receiving the delivery request is "22:00", the delivery server 10 specifies the sound level manipulation "sound level setting (5)" in correspondence to the time zone "21:01 to 10:01" including the time point. Next, the delivery server 10 determines the reproduction mode of reproducing the audio contained in the content at the sound level "5".

Subsequently, the delivery server 10 performs the control process of controlling the audio contained in the content in the determined reproduction mode (step S5). For example, the delivery server 10 generates the reproduction instruction of instructing the terminal device to reproduce the content in a mute state. Next, the delivery server 10 transmits the content and the reproduction instruction to the terminal device 100 (step S6). As a result, the terminal device 100 reproduces the audio contained in the content in accordance with the reproduction instruction (step 37).

In this manner, the delivery server 10 collects the information on the user A using the terminal device 100 and learns the sound level manipulation relating to the sound level of the terminal device 100 used by the user A based on the collected information on the user A. In addition, the delivery server 10 determines the reproduction mode at the time when the terminal device 100 reproduces the audio contained in the content according to the learning result of the learning process. Next, the delivery server 10 controls the audio contained in the content in the reproduction mode determined by the determination process.

Therefore, the delivery server 10 can improve user's convenience. For example, the delivery server 10 learns the fact that the user A gets in an electric train in a predetermined time zone such as a commuting time and sets the sound level of the terminal device 100 to a mute state. In this case, in a case where the delivery server 10 delivers the audio-containing content in a predetermined time zone such as a commuting time, the delivery server controls the audio in the content to be in the mute state. As a result, the delivery server 10 can control the audio contained in the content to be in the mute state although the user forgets to set the sound level of the terminal device 100 to be in the mute state when the user gets in the electric train in a predetermined time zone such as a commuting time.

In addition, in a time zone when the user A sets the sound level to "5", since the delivery server 10 can determine that the user A is positioned at a place such as user's home where the audio is allowed to be output, the delivery server controls the audio contained in the content to be at the sound level "5". Therefore, in a case where the delivery server 10 can determine that the user A is positioned at a place such as user's home where the audio is allowed to be output, the delivery server can output an audio which the user is desired to hear such as an audio in a video content relating to advertisement.

In addition, the delivery server 10 may perform the above-described various processes for every terminal device or for every user. For example, the delivery server 10 may identify the terminal devices by using techniques of IP addresses of the terminal devices, IDs allocated to the terminal devices, cookies, or the like and perform the above-described various processes for every terminal device.

Hereinafter, an example of a functional configuration of the delivery server 10 implementing the above-described selection process will be described.

3. Configuration of Delivery System

Figure 2:
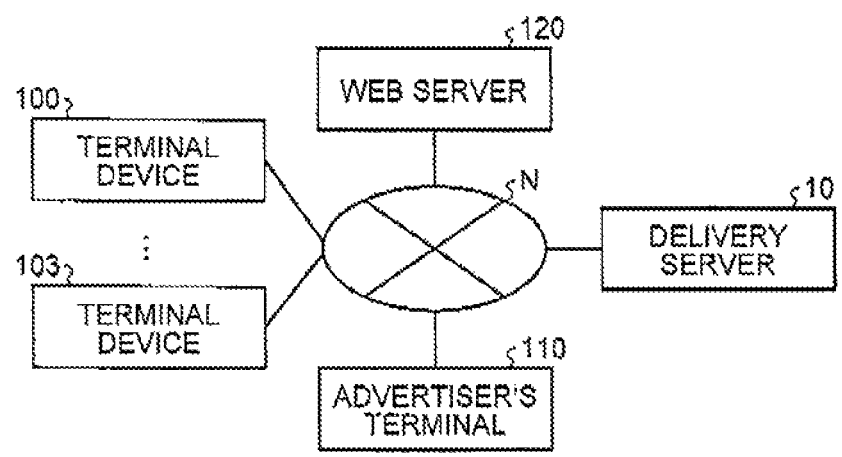
FIG. 2 is a diagram illustrating an example of a configuration of a delivery system according to the embodiment.

First, a configuration of a delivery system including the delivery server 10 according to the embodiment will be described with reference to FIG. 2. FIG. 2 is a diagram illustrating an example of the configuration of the delivery system according to the embodiment. As illustrated in FIG. 2, the delivery system includes the delivery server 10, a plurality of terminal devices 100 to 103, an advertiser's terminal 110, and a web server 120. The delivery server 10, the terminal devices 100 to 103, the advertiser's terminal 110, and the web server 120 are communicably connected to each other in a wired or wireless manner via the network N. In addition, besides, the delivery system illustrated in FIG. 2 may include a plurality of the terminal devices 100, a plurality of the advertiser's terminals 110, a plurality of the web servers 120, or a plurality of the delivery servers 10.

The terminal device 100 is an information processing apparatus used by the user which browses the web page. For example, the terminal device 100 is a mobile phone such as a smart phone, a tablet terminal, a PDA (personal digital assistant), a desktop PC (personal computer), a notebook PC, or the like. The terminal device 100 acquires the web page from the web server 120 according to the manipulation of the user and displays the acquired web page. In addition, in a case where the web page includes an acquisition command for a content described later, the terminal device 100 transmits the delivery request for the content to the delivery server 10 to acquire the audio-containing content. Next, the terminal device 100 arranges the acquired content at a predetermined position in the web page to reproduce the content according to the condition.

The advertiser's terminal 110 is an information processing apparatus used by an advertiser. For example, the advertiser's terminal 110 is a desktop PC, a notebook PC, a tablet terminal, a mobile phone, a PDA, or the like. The advertiser's terminal 110 submits the content to the delivery server 10 according to the manipulation of the advertiser. For example, the advertiser's terminal 110 submits, as the content, an audio-containing video or an audio of the advertisement content, a URL (uniform resource locator) for acquiring a content (for example, a landing page) corresponding to the content to the delivery server 10.

In addition, there is a case where the advertiser requests an agency to submit the advertisement content. In this case, the entity of submitting the advertisement content to the delivery server 10 is the agency. Hereinafter, it is assumed that the term "advertiser" has a concept including the agency as well as the advertiser, and the term "advertiser's terminal" has a concept including an agency apparatus used by the agency as well as the advertiser's terminal 110.

In addition, in a case where the content which is to be delivered by the delivery server 10 is not an advertisement content but a video or audio posted by the user or the like, the delivery server 10 receives content registration from an arbitrary user terminal used by the user. In addition, the delivery server 10 may receive content registration from a terminal of a company such as a content holder which presides over the content delivery.

The web server 120 is a server or the like which delivers the web page to the terminal device 100. For example, the web server 120 delivers to the terminal device 100 a web page of a portal site where various types of information relating to portal sites, news sites, auction sites, weather forecast sites, shopping sites, finance (stock price) sites, route search sites, map providing sites, travel sites, restaurant introducing sites, web blogs, or the like are arranged. In addition, the web server 120 may be a server which transmits to the terminal device 100 a web page where various types of information are arranged in a shape of tiles and information updating or the like is performed for every tile.

Herein, the web page which is to be delivered by the web server 120 includes the acquisition command for the content which is to be arranged in the web page. For example, in an HTML file or the like forming the web page, the URL or the like of the delivery server 10 is described as the acquisition command. In this case, the terminal device 100 acquires the content from the delivery server 10 by accessing the URL described in the HTML file or the like. In addition, the URL may be described as an acquisition command for advertisement which is arranged in a web page of the portal site or the like or may be described as an acquisition command for a content which is arranged in a web page of a video delivery site or the like.

The delivery server 10 is a server or the like which delivers various types of contents. In addition, the delivery server 10 may be a cloud system implementing a functional configuration of the delivery server 10 described later. If the delivery server 10 receives the delivery request for the content for the terminal device 100, the delivery server selects the content which is to be transmitted to the terminal device 100 and delivers the selected content. In addition, the terminal device 100 performs the above-described learning process, determination process, and control process and controls a mode at the time when the terminal device 100 reproduces the audio contained in the content.

4. Configuration of Delivery Server

Next, a configuration of the delivery server 10 according to the embodiment will be described with reference to FIG. 3. FIG. 3 is a diagram illustrating an example of the configuration the delivery server according to the embodiment. As illustrated in FIG. 3, the delivery server 10 communicates data with the terminal device 100 and the advertiser's terminal 110 via the network N.

Herein, as illustrated in FIG. 3, the delivery server 10 includes a communication unit 11, a storage unit 12, and a controller 13. In addition, the internal configuration of the delivery server 10 is not limited to the configuration illustrated in FIG. 3, but any other configurations which can perform the above-described selection process may be employed.

The communication unit 11 is embodied with, for example, an NIC (network interface card) or the like. In addition, the communication unit 11 is connected to the network N in a wired or wireless manner to communicate information with the terminal device 100 and the advertiser's terminal 110.

The storage unit 12 is embodied with, for example, a semiconductor memory device such as a RAM (random access memory) or a flash memory or a storage device such as a hard disk or an optical disk. The storage unit 12 stores the log information database 14, the attribute information database 15, the learning result database 16, and a delivery information database 17.

The controller 13 is embodied, for example, by a CPU (central processing unit), an MPU (micro processing unit), or the like executing various programs stored in the storage device inside the delivery server 10 using the P-AN as a working area. In addition, the controller 13 is embodied with, for example, an integrated circuit such as an ASIC (application specific integrated circuit) or an FPGA (field programmable gate array).

In addition, the controller 13 operates as a reception unit 18, a collection unit 19, a learning unit 20, a determination unit 21, and an audio controller 22 by executing a control program stored in the storage device inside the delivery server 10 using the RAM as a working area.

4-1. Example of Log Information Database

Subsequently, an example of information stored in the storage unit 12 will be described. The log information database 14 is a database where the log information of the user is registered. For example, FIG. 4 is a diagram illustrating an example of the log information database according to the embodiment. In the example illustrated in FIG. 4, the user IDs, the log information, and the time points in correspondence to each other are stored in the log information database 14.

For example, in the example illustrated in FIG. 4, the log information and the time point described hereinafter in correspondence to the user ID "user A" are stored in the log information database 14. For example, the log information "network: wide area network A" indicating the network which the terminal device 100 accesses in correspondence to the time point "2014/05/13/20:55", the log information "position: position A" indicating the position of the terminal device 100 in correspondence to the time point "2014/05/13/21:00", and the like are registered in the log information database 14. In addition, the log information "manipulation: start reproduction" indicating the fact that the terminal device 100 starts the reproduction of the audio-containing content in correspondence to the time point "2014/05/13/21:01", the log information "manipulation; sound level setting (5)" which is sound level manipulation in correspondence to the time point "2014/05/13/21:01", and the like are registered in the log information database 14.

In addition, the log information "manipulation: stop reproduction" indicating the fact that the terminal device 100 stops the reproduction of the content in correspondence to the time point "2014/05/14/11:15", the log information "manipulation: mute setting" which is the sound level manipulation indicating the fact that the sound level is set to a mute state in correspondence to the time point "2014/05/14/11:16", and the like are registered in the log information database 14. In addition, the log information "browsing: web content A" indicating the fact that the terminal device 100 displays a content (for example, a web page) separately from the content which the delivery server 10 delivers in correspondence to the time point "2014/05/14/12:16", the log information "function: entrance into thicket gate" indicating the fact that the user enters the ticket gate of the station by using a function such as FeliCa (registered trade mark) included in the terminal device 100 in correspondence to the time point "2014/05/14/21:15", the log information "function: exit from thicket gate" indicating the fact that the user exists the ticket gate of the station in correspondence to the time point "2014/05/14/22:30", and the like are registered in the log information database 14.

In addition, besides the above-described log information, it is assumed that arbitrary log information such as a position of the terminal device 100 or the user A, manipulation on the terminal device 100, sound level manipulation, a physical state of the terminal device 100, and a history of functions included in the terminal device 100 is registered in the log information database 14.

4-2. Example of Attribute Information Database

Subsequently, an example of the information registered in the attribute information database 15 will be described. FIG. 5 is a diagram illustrating the example of the attribute information database according to the embodiment. In the example illustrated in FIG. 5, the user ID and the attribute information of the user in correspondence to each other are registered in the attribute information database 15. For example, in the example illustrated in FIG. 5, the user ID "user A" of the user A, the attribute information "gender: female" indicating the fact that the user A is female, the attribute information "age: thirties" indicating the fact that the user A is in thirties, the attribute information "job: office worker" indicating that the user is an office worker, the attribute information "hobby: listening to music" indicating the fact that the hobby of the user A is listening to music, the attribute information "address: XXXX" indicating the address in correspondence to each other are registered in the attribute information database 15.

In addition, it is assumed that, besides the above-described attribute information, arbitrary attribute information indicating the attribute of the user is registered in the attribute information database 15. In addition, the attribute information registered in the attribute information database 15 may be attribute information which is registered in advance by the user, and the attribute information of a user which is estimated from the log information or the like relating to the user may be registered.

4-3. Example of Learning Result Database

Subsequently, an example of the information registered in the learning result database 16 will be described. FIG. 6 is a diagram illustrating the example of the learning result database according to the embodiment. In the example illustrated in FIG. 6, the user ID, the sound level manipulation, the time zone, and the condition in correspondence to each other are registered in the learning result database 16. Herein, the condition denotes various conditions which are learned in association with the sound level manipulation.

For example, in the example illustrated in FIG. 6, the user ID "user A" of the user A, the sound level manipulation "sound level manipulation (5)", and the time zone "21:01 to 10:01" in correspondence to each other are registered, and the user ID "user A" of the user A, the sound level manipulation "mute setting", and the time zone "11:16 to 11:45" in correspondence to each other are registered in the learning result database 16. In addition, the user ID "user A", the sound level manipulation "sound level manipulation (5)", and the condition "start reproduction" in correspondence to each other are registered in the learning result database 16. In addition, the sound level manipulation "mute setting" and the condition "entrance into thicket gate" in correspondence to each other are registered, and the user ID "user A", the sound level manipulation "mute setting", and the condition "Wi-Fi network B" in correspondence to each other are registered in the learning result database 16.

4-4. Example of Delivery Information Database

Subsequently, an example of the information registered in the delivery information database 17 will be described. FIG. 7 is a diagram illustrating the example of the information stored in the delivery information database according to the embodiment. In the example illustrated in FIG. 7, the delivery information database 17 has items of advertiser ID, advertisement content, number of impressions, number of guaranteed impressions, and price. In addition, the delivery information database 17 may further store information for matching the content with the user or information such as a CTR (click through rate).

The "advertiser ID" indicates identification information for identifying the advertiser or the advertiser's terminal 110. The "advertisement content" indicates the content submitted from the advertiser's terminal 110, that is, the content relating to advertisement. In FIG. 7, the example where conceptual information such as "C20" to "C60" is stored in the "advertisement content" is illustrated. However, actually, arbitrary audio-containing content such as an audio-containing video, an audio and an image, audio and text data, or an advertisement in a game format including an audio, a URL where such a content is located, or a file path name indicating a storage location thereof is stored.

The "number of impressions" indicates the number of times of display of the advertisement content. In addition, the "number of guaranteed impressions" indicates the number of times of display of the advertisement which is compensated for the price. In addition, the "price" indicates a reward paid by the advertiser when the advertisement content is displayed by times corresponding to the "number of guaranteed impressions". Namely, the delivery server 10 is a server which delivers the content relating to advertisement in an impression-guaranteed manner.

Namely, FIG. 7 illustrates an example where an advertiser identified by the advertiser ID "B10" submits the contents C20 to C40. In addition, FIG. 7 illustrates an example where, with respect to the content "C20", the number of impression is "10000", the number of guaranteed impressions is "20000", and the amount of charged fee when the content "C20" is displayed by times corresponding to the number of guaranteed impressions is "aaa".

Herein, a reproduction control instruction of instructing which reproduction mode is used when the content is reproduced as the advertisement content is registered in the delivery information database 17. For example, it is assumed that the reproduction control instruction includes an instruction indicating a position where the content C20 is arranged, a condition where the reproduction of the content C20 is started, a condition whether or not the control of the sound level is performed by the above-described determination and control processes when the content C20 is reproduced, and which reproduction mode is used when the content is reproduced, an instruction indicating which reproduction mode is determined in which state, and information such as a URL of a landing page.

In addition, in a case where the content relating to advertisement is delivered in a click charging manner where charging is performed when the advertisement content is selected, the number of selections of the content, the amount of charged fee when the content is selected, and the like are registered in the delivery information database 17. In addition, in a case where, when the delivery request is received, the advertisement content is selected in an auction manner, and the selected advertisement content is delivered, the bidding price which is an advertisement fee set by the advertiser as the reward per impression, the CTR, and the like are registered in the delivery information database 17.

4-5. Example of Processes Performed by Controller

Returning to FIG. 3, details of the processes performed by the reception unit 18, the collection unit 19, the learning unit 20, the determination unit 21, and the audio controller 22 included in the controller 13 will be described.

The reception unit 18 receives the submission of the content from the advertiser's terminal 110. For example, the reception unit 18 receives the submission of the number of guaranteed impressions and the advertisement content. In addition, the reception unit 18 receives the content and the reproduction control instruction. In this case, the reception unit 18 registers the content and the reproduction control instruction together with the advertiser ID and the received number of guaranteed impressions in the delivery information database 17. In addition, the reception unit 18 may register the number of guaranteed impressions or the prices set by providers of various services provided by not the advertiser of terminal 110 but the advertiser of the delivery server 10 in the delivery information database 17.

The collection unit 19 collects the information on the user A. For example, the collection unit 19 collects the log information relating to the user A and the time point when the log information is acquired from the terminal device 100 or various log servers (not shown) or the like and registers the collected log information and the collected time point in correspondence to the user ID "user A" in the log information database 14. In addition, the collection unit 19 collects the attribute information registered by the user A from the terminal device 100, an external server, or the like and registers the collected attribute information and the user ID "user A" in correspondence to each other in the attribute information database 15. In addition, the collection unit 19 may estimate the attribute information of the user A from the log information corresponding to the user ID "user A" and register the estimated attribute information in the attribute information database 15.

The learning unit 20 learns the sound level manipulation relating to the sound level of the terminal device 100 used by the user A based on the information on the user A. More specifically, the learning unit 20 specifies the sound level manipulation in a predetermined condition based on the log information corresponding to the user ID "user A" and stores the learning result in association of the predetermined condition with the specified sound level manipulation in the learning result database 16.

For example, the learning unit 20 learns the sound level manipulation associated with the situation of the terminal device 100. Namely, the learning unit 20 specifies the situation of the terminal device 100 from the log information and specifies the sound level manipulation in the specified situation. Next, the learning unit 20 stores the specified situation and the specified sound level manipulation in correspondence to each other in the learning result database 16. Herein, as the situation of the terminal device 100, the manipulation on the terminal device 100, the position of the terminal device, the network which the terminal device 100 accesses, the entrance and exit using the terminal device 100, and arbitrary situations which can be specified from the log information can be employed.

Hereinafter, a specific example of the process performed by the learning unit 20 will be described. For example, the learning unit 20 learns the sound level manipulation in association with the history of manipulation on the terminal device 100. For example, the learning unit 20 specifies the log information relating to the manipulation on the terminal device 100. In addition, the learning unit 20 determines based on the specified log information whether or not common sound level manipulation is performed after the manipulation for each type manipulation. Next, in a case where the common sound level manipulation is performed after the manipulation, the learning unit 20 uses the manipulation as a condition and registers the learning result in association of the commonly-performed sound level manipulation with the condition in the learning result database 16.

For example, in the example illustrated in FIG. 4, after the log information "manipulation: start reproduction", the sound level manipulation "manipulation: sound level setting (5)" or the sound level manipulation "manipulation: sound level setting (4)" is performed. Therefore, the learning unit 20 registers the learning result in association of the condition "start reproduction" with the sound level manipulation "sound level setting (5)" or the learning result of the condition "start reproduction" with the sound level manipulation "sound level setting (4)" in the learning result database 16. In addition, the learning unit 20 may specify the sound level manipulation registered as the learning result according to which one of the sound level manipulation "manipulation: sound level setting (5)" and the sound level manipulation "manipulation: sound level setting (4)" is much more performed after the log information "manipulation: start reproduction".

In addition, the learning unit 20 learns the sound level manipulation in association with the position of the terminal device 100. For example, the learning unit 20 specifies the log information indicating the position from the log information. In addition, the learning unit 20 specifies the sound level manipulation performed at the position indicated by the specified log information. Next, the learning unit 20 registers the learning result in association of the specified position with the specified sound level manipulation in the learning result database 16.

For example, in the example illustrated in FIG. 4, after 1 minute from the time when the log information "position: position A" indicating the position is acquired, the sound level manipulation "manipulation: sound level setting (5)" is performed; and after 56 minutes from the time when the log information "position: position B" indicating the position is acquired, the sound level manipulation "manipulation: mute setting" is performed. Herein, since the sound level manipulation "manipulation: sound level setting (5)" is performed after 1 minute from the time when the log information "position: position A" indicating the position is acquired, it is estimated that the learning associated with the position may be performed. However, since the sound level manipulation "manipulation: mute setting" is performed after 56 minutes from the time when the log information "position: position B" indicating the position is acquired, the probability that the learning associated with the position is not appropriate is high.

Therefore, the learning unit 20 excludes the sound level manipulation after a predetermined time (for example, 20 minutes) from the time when the log information indicating the position is acquired from the learning result. As a result, for example, the learning unit 20 registers only the learning result in association of the condition "position: position A" with the sound level manipulation "sound level setting (5)" in the learning result database 16.

In addition, the learning unit 20 learns the sound level manipulation in association with the network which the terminal device 100 accesses. For example, the learning unit 20 specifies the log information indicating the network which the terminal device 100 accesses from the log information and specifies the sound level manipulation performed when the terminal device accesses the specified network. Next, the learning unit 20 registers the learning result in association of the specified network with the sound level manipulation performed when the terminal device 100 accesses the network in the learning result database 16.

For example, in the example illustrated in FIG. 4, from the time when the log information "network: wide area network A" is acquired to the time when the log information "network: Wi-Fi network B" is acquired, the sound level manipulation "manipulation: sound level setting (5)", the sound level manipulation "manipulation: sound level setting (4)", and the sound level manipulation "manipulation: mute setting" are performed. On the other hand, from the time when the log information "network: Wi-Fi network B" is acquired to the time when the log information "network: wide area network A" is acquired, only the sound level manipulation "manipulation: mute setting" is performed. In this case, although the learning unit 20 cannot determine the sound level setting appropriate to the time when the terminal device 100 accesses the "wide area network A", the learning unit can determine that it is appropriate that the sound level of the terminal device 100 is set to the "mute setting" during the time when the terminal device 100 accesses the "Wi-Fi network B". Therefore, the learning unit 20 registers the learning result in association of the condition "Wi-Fi network B" with the sound level manipulation "mute setting" in the learning result database 16.

In addition, the learning unit 20 learns the sound level manipulation in association with the history of entrance and exit using the terminal device 100. For example, the learning unit 20 specifies the log information indicating the history of entrance and exit using the terminal device 100 from the log information and specifies the sound level manipulation performed before and after the entrance and exit indicated by the log information. Next, the learning unit 20 uses the specified log information indicating the history of entrance and exit as a condition and registers the learning result in association of the specified sound level manipulation with the condition in the learning result database 16.

For example, in the example illustrated in FIG. 4, immediately after the log information "function: entrance into thicket gate" is acquired, the log information "manipulation: mute setting" is acquired. Therefore, the learning unit 20 registers the learning result in association of the condition "entrance into thicket gate" with the sound level manipulation "mute setting" in the learning result database 16.

In addition, besides the above-described conditions, the learning unit 20 can learn the sound level manipulation in association with an arbitrary condition. For example, the learning unit 20 may specify the time zone when the sound level manipulation is performed and register the learning result in association of the specified time zone with the sound level manipulation performed in the time zone in the learning result database 16.

The determination unit 21 determines the reproduction mode at the time when the terminal device 100 reproduces the audio contained in the content according to the learning result of the learning unit 20. More specifically, if the determination unit 21 receives the delivery request from the terminal device 100, the determination unit specifies the log information acquired within a predetermined time period after the reception of the delivery request by referring to the log information database 14. In addition, the determination unit 21 specifies the condition which the terminal device 100 or the user A satisfies at the time of content delivery from the specified log information and specifies the sound level manipulation associated with the specified condition from the learning result database 16. Next, the determination unit 21 determines the reproduction mode according to the specified sound level manipulation.

For example, the determination unit 21 specifies the situation of the terminal device 100 at the time when the terminal device 100 acquires the content and specifies the sound level manipulation associated with the specified state of the terminal device 100 from the learning result database 16. Next, the determination unit 21 determines the reproduction mode of reproducing the audio contained in the content with the specified sound level manipulation.

In addition, for example, the determination unit 21 specifies the manipulation performed at the time when the terminal device 100 acquires the content and specifies the sound level manipulation associated with the specified manipulation from the learning result database 16. Next, the determination unit 21 determines the reproduction mode of reproducing the audio contained in the content with the specified sound level manipulation. For example, in a case where the log information "manipulation: start reproduction" is acquired at the time when the terminal device 100 acquires the content, the determination unit 21 specifies the sound level manipulation "sound level manipulation (5)" associated with the condition "start reproduction" from the learning result database 16 and determines the reproduction mode according to the specified sound level manipulation.

In addition, for example, the determination unit 21 specifies the position of the terminal device 100 at the time when the terminal device 100 acquires the content and specifies the sound level manipulation associated with the specified position from the learning result database 16. Next, the determination unit 21 determines the reproduction mode of reproducing the audio contained in the content with the specified sound level manipulation.

In addition, for example, the determination unit 21 specifies the network which the terminal device accesses at the time when the terminal device 100 acquires the content and specifies the sound level manipulation associated with the specified network from the learning result database 16. Next, the determination unit 21 determines the reproduction mode of reproducing the audio contained in the content with the specified sound level manipulation. For example, in a case where the log information "network: Wi-Fi network B" is acquired at the time when the terminal device 100 acquires the content, the determination unit 21 specifies the sound level manipulation "mute setting" associated with the condition "Wi-Fi network B" from the learning result database 16 and determines the reproduction mode according to the specified sound level manipulation.

In addition, for example, the determination unit 21 specifies the entrance and exit performed before and after the time when the terminal device 100 acquires the content and specifies the sound level manipulation associated with the specified entrance and exit from the learning result database 16. Next, the determination unit 21 determines the reproduction mode of reproducing the audio contained in the content with the specified sound level manipulation. For example, in a case where the log information "function: entrance into thicket gate" is acquired at the time when the terminal device 100 acquires the content, the determination unit 21 specifies the sound level manipulation "mute setting" associated with the condition "entrance into thicket gate" from the learning result database 16 and determines the reproduction mode according to the specified sound level manipulation.

In addition, besides the above-described conditions, the determination unit 21 may determine the reproduction mode according to the sound level manipulation associated with an arbitrary condition at the time when the terminal device 100 acquires the content. For example, the determination unit 21 specifies the sound level manipulation associated with the time zone including the time point of receiving the delivery request from the learning result database 16. Next, the determination unit 21 may determine the reproduction mode according to the specified sound level manipulation.

In addition, the determination unit 21 may determine the reproduction mode according to the history of entrance and exit performed before and after the time when the terminal device 100 acquires the content. For example, it is estimated that, from the time when the log information indicating the fact that the user enters the ticket gate of the station by using the terminal device 100 is acquired to the time when the log information indicating the fact that the user exits the ticket gate of the station is acquired, the audio may be set to the "mute setting". Therefore, in a case where, before the reception of the delivery request, log information "function: entrance into thicket gate" is acquired, and the log information "function; exit from thicket gate" is not acquired, the determination unit 21 may determine the reproduction mode of reproducing the audio with the "mute setting" irrespective of the learning result.

The audio controller 22 is a controller which controls the audio contained in the content in the reproduction mode determined by the determination unit 21. For example, if the audio controller 22 receives the delivery request, the audio controller acquires the to-be-delivered content from the delivery information database 17. More specifically, the audio controller 22 selects the to-be-delivered content from the contents associated with the advertisement registered in the delivery information database 17 according to the number of impressions and the number of guaranteed impressions for each content so that the number of impressions for each content is larger than the number of guaranteed impressions. In addition, the audio controller 22 may perform content selection by considering matching with the user having the terminal device 100 or matching according to the state of the terminal device 100.

Subsequently, the audio controller 22 generates a reproduction instruction of allowing the audio contained in the content acquired from the delivery information database 17 to be reproduced in the reproduction mode determined by the determination unit 21. Next, the audio controller 22 transmits the acquired content and the reproduction instruction to the terminal device 100.

In addition, the audio controller 22 may edit the audio of the content acquired from the delivery information database 17 so that the audio is to be reproduced in the reproduction mode determined by the determination unit 21 and transmit the audio-edited content to the terminal device 100. Namely, only if the audio contained in the content is reproduced in the reproduction mode determined by the determination unit 21, the audio controller 22 can employ an arbitrary control method.

5. Modified Example

The above-described delivery server 10 according to the embodiment may be embodied in various forms besides the above-described embodiment. Therefore, hereinafter, other embodiments of the delivery server 10 will be described. In addition, it is assumed that, among below-described processes performed by the delivery server 10, a process corresponding to the learning process is performed by the learning unit 20, a process corresponding to the determination process is performed by the determination unit 21, and a process corresponding to the control process is performed by the audio controller 22.

5-1. Processes According to Type of Content

For example, the delivery server 10 specifies the sound level manipulation performed within a predetermined time period after the terminal device 100 reproduces the content delivered from the delivery server 10 from the log information and generates the learning result in association of the specified sound level manipulation with the type of the content delivered from the delivery server 10. In addition, if the delivery server 10 receives the delivery request from the terminal device 100, the delivery server selects the content which is an object of delivery from the delivery information database 17. Next, the delivery server 10 specifies the sound level manipulation associated with the type of the selected content and determines the reproduction mode according to the specified sound level manipulation.

For example, when the type of the content delivered from the delivery server 10 is a video posted by the user, in a case where the sound level manipulation "manipulation: sound level setting (5)" is performed many times, the delivery server 10 generates the learning result in association of the type of content "user-posting image" with the sound level manipulation "sound level setting (5)" In addition, when the type of the content delivered from the delivery server 10 is a video content relating to advertisement arranged in the web page, in a case where the sound level manipulation "manipulation: mute setting" is performed many times, the delivery server 10 generates the learning result in association of the type of content "advertisement content" with the sound level manipulation "mute setting".

In this case, in the case were the type of the content selected as a to-be-delivered content at the time of receiving the delivery request is a video posted by the user, the delivery server 10 determines the reproduction mode of reproducing the audio with the "sound level setting (5)", and in a case where the type of the content selected is a video content relating to advertisement, the delivery server determines the reproduction mode of reproducing the audio with the "mute setting".

In addition, in a case where the delivery server 10 delivers the content of which audio control is allowed by the entity of registration among the contents relating to the registered advertisement, the delivery server may determine the reproduction mode according to the learning result, and in a case where the delivery server delivers the content of which audio control is not allowed by the entity of registration, the delivery server may deliver only the content. In addition, in another example, in a case where the received content is a content relating to advertisement, the terminal device 100 may determine the reproduction mode according to the learning result, and in a case where the received content is a game or a video not relating to advertisement, the terminal device may not determine the reproduction mode but may deliver only the content.

In this manner, the delivery server 10 determines the reproduction mode of the audio contained in the content according to the type of the content. Therefore, the delivery server 10 can improve user's convenience.

5-2. Processes According to Display Content

In addition, the delivery server 10 may learn the sound level manipulation in association with the type of the content (hereinafter, referred to as a display content) which the terminal device 100 displays separately from the content which the delivery server 10 delivers and may determine the reproduction mode according to the sound level manipulation associated with the display content which the terminal device 100 displays when the delivery server 10 delivers the content. For example, the delivery server 10 specifies the sound level manipulation performed before and after the terminal device displays the web content from the log information for each web content which the terminal device 100 displays. Next, the delivery server 10 generates the learning result in association of the specified sound level manipulation with the specified type of the web content.

For example, in a case where sound level manipulation "manipulation: sound level setting (5)" is performed many times before and after the web content relating to sports such as web pages relating to soccer or baseball is displayed, the delivery server 10 generates the learning result in association of the type of display content "sports" with the sound level manipulation "sound level setting (5)". In addition, in a case where the sound level manipulation "manipulation: mute setting" performed many times before and after the web content relating to news such as a portal site or a news site is displayed, the delivery server 10 generates the learning result in association of the type of display content "news" with the sound level manipulation "mute setting".

In this case, in a case where the delivery server 10 receives the delivery request from the terminal device 100, the delivery server determines the type of the display content which the terminal device 100 displays by using techniques of cookies or the like. Next, in a case where the type of the specified display content is "sports", the delivery server 10 determines the reproduction mode of reproducing the sound level with the "sound level setting (5)", and in a case where the type of the specified display content is "news", the delivery server determines the reproduction mode of reproducing the sound level with the "mute setting". Next, the delivery server 10 performs control so that the audio is output in the determined reproduction mode together with the delivery of the content.

In this manner, the delivery server 10 learns the sound level manipulation in association with the type of the display content and determines the reproduction mode according to the sound level manipulation associated with the type of the display content which the terminal device 100 displays at the time of content delivery. Therefore, the delivery server 10 can improve user's convenience.

5-3. Processes According to Physical State of Terminal

In addition, the delivery server 10 may learn the sound level manipulation associated with the physical state of the terminal device 100 from the log information and determine the reproduction mode according to the sound level manipulation associated with the physical state of the terminal device 100 at the time when the terminal device 100 acquires the content.

For example, it is considered that the delivery server 10 can estimate the state of the user using the terminal device 100 based on a slope, an acceleration, a temperature, a sound level, a brightness, and the like of the terminal device 100. As more specific example, in a case where the slope of the terminal device 100 is larger than a predetermined threshold value, the delivery server 10 may estimate that the user is using the terminal device 100 in the state where the user is lying. In addition, for example, in a case where acceleration or impact relating to the terminal device 100 somewhat matches a predetermined pattern, the delivery server 10 can estimate that the user is moving. In addition, for example, the delivery server 10 can estimate the position of the user or the movement means of the user from the position or the moving speed of the terminal device 100 specified by using a GPS (global positioning system), iBeacon, or the like. As a specific example, in a case where a railway exists in the vicinity of the position of the user and the moving speed of the user is higher than a predetermined threshold value, the delivery server 10 can estimate that the user is getting in an electric train.

Therefore, the delivery server 10 learns the sound level manipulation performed in this state in association with the physical state of the terminal device 100 from the log information for each of the physical states of a slope, acceleration, temperature, a sound level, brightness, and the like of the terminal device 100. Next, the delivery server 10 specifies the physical state of the terminal device 100 at the time of receiving the delivery request and determines the reproduction mode according to the sound level manipulation associated with the specified physical state. In other words, the delivery server 10 learns the sound level manipulation in the state for each state of the user which is estimated from the physical state of the terminal device 100 and determines the reproduction mode according to the sound level manipulation associated with the state of the user which is estimated from the physical state of the terminal device 100 at the time of content delivery.

For example, the delivery server 10 may learn the sound level manipulation for each magnitude of noise around the terminal device which the terminal device 100 measures and determine the reproduction mode according to the sound level manipulation associated with the magnitude of the noise around the terminal device 100 which is measured at the time of content delivery. As a result, the delivery server 10 can improve user's convenience.

5-4. Processes According to Setting of Terminal in Periphery

In addition, the delivery server 10 may learn the sound level manipulation in association with the sound level of a different terminal device existing in the periphery of the terminal device 100 and determine the reproduction mode according to the sound level manipulation associated with the sound level of the different terminal device existing in the periphery of the terminal device 100 when the terminal device 100 acquires the content.

For example, in a case where the terminal device in the periphery thereof is in the state where the terminal device outputs the sound at a predetermined sound level, it is estimated that the terminal device 100 does not cause discomforts to the periphery even though the audio is output. Therefore, for example, the delivery server 10 compares the log information indicating the position of the terminal device 100 with the log information indicating the position of the different terminal device and specifies the different terminal device located in the periphery of the terminal device 100 for each position where the terminal device 100 is located. In addition, the delivery server 10 specifies the sound level of the specified different terminal device from the log information of the different terminal device for each position where the terminal device 100 is located. In addition, the delivery server 10 specifies the sound level manipulation at the time when the terminal device 100 is located at the position for each position where the terminal device 100 is located.

Next, the delivery server 10 generates the learning result in association of the specified sound level of the different terminal device with the specified sound level manipulation of the terminal device 100 for each position where the terminal device 100 is located. After that, if the delivery server 10 receives the delivery request, the delivery server specifies the sound level of the different terminal device existing in the periphery of the terminal device 100 and determines the reproduction mode according to the sound level manipulation of the terminal device 100 associated with the specified sound level.

As a result, for example, since the different terminal device in the periphery outputs the audio, the delivery server 10 can learn the sound level manipulation performed so that the terminal device 100 outputs the audio, or since the different terminal device in the periphery does not output the audio, the delivery server can learn the sound level manipulation performed so that the terminal device 100 does not output the audio. Next, the delivery server 10 determines the reproduction mode according to the sound level manipulation associated with the sound level of the different terminal device located in the periphery of the terminal device 100 at the time of content delivery. Therefore, since the delivery server 10 can allow the content to be reproduced at the sound level matching with the different terminal device in the periphery thereof, the delivery server can improve user's convenience.

In addition, the delivery server 10 may perform learning in association of a ratio of terminal devices where the audio is not set to the mute state among the different terminal devices in the periphery thereof or a condition based on the sound level to which each terminal device is set with the sound level manipulation of the terminal device 100. In addition, the delivery server 10 may perform learning in association of the sound level manipulation of the terminal device 100 with the sound level of the different terminal device in the periphery thereof in each predetermined time zone. In addition, the delivery server 10 may collect the states or settings of the different terminal devices located in the periphery of the terminal device 100 by using SNS (social networking service) and learn the sound level manipulation for each of the collected states or settings. In addition, the delivery server 10 may learn the sound level manipulation for each information which the different terminal device located within a short distance from the terminal device 100 posts to the SNS.

5-5. Other Conditions

In addition, the delivery server 10 may perform learning in association of a condition as a combination of the above-described various conditions with the sound level manipulation. For example, the delivery server 10 may learn the sound level manipulation based on a combination of a predetermined time zone and a history of entrance and exit and determine the reproduction mode according to the sound level associated with a combination of the time zone at the time of receiving the delivery request from the terminal device 100 and the history of entrance and exit acquired before and after the reception of the delivery request.

In addition, the delivery server 10 may learn the sound level manipulation for each condition considering the attribute information of the user. For example, the delivery server 10 may determine the reproduction mode according to the sound level manipulation associated with a combination of the condition based on the attribute information such as gender, age, job, hobby, address, or the like of the user and the above-described arbitrary conditions.

In addition, beside the above-described conditions, the delivery server 10 may learn the sound level manipulation in association with the arbitrary conditions. For example, the delivery server 10 may learn the sound level manipulation for each condition according to intention of the advertiser which is an entity of registration of the content or intention of a service provider which provides the service which is to be supplied by the delivery server 10. In addition, for example, the delivery server 10 analyses the information which the user posts to the SNS or the like and learns the sound level manipulation at the time when the associated posting is performed in association with the type of the details of the posting such as the posting relating to music or the posting relating to news. Next, the delivery server 10 may determine the reproduction mode according to the sound level manipulation associated with the type of the details of the information which the user posts before and after the reception of the delivery request.

In addition, the delivery server 10 may not define the sound level manipulation itself which is performed at the time when the predetermined condition is satisfied as the learning result from the log information but may define the sound level manipulation which can be obtained by statistically analyzing the sound level manipulation as the learning result. For example, the delivery server 10 specifies all the sound level manipulation performed at the time when the predetermined condition is satisfied and specifies the sound level manipulation optimal to the state where the condition is satisfied according to the details and result of the specified sound level manipulation, the time point when the sound level manipulation is performed, and the like. Next, the delivery server 10 may define the specified optimal sound level manipulation in association with the condition as the learning result. Namely, if the delivery server 10 learns the sound level manipulation from the information on the user, the delivery server can perform learning in an arbitrary form.

In addition, the delivery server 10 may learn the sound level manipulation in association with the biometric information (so-called bio logic data) of the user and determine the reproduction mode according to the learning result. For example, the delivery server 10 collects the bio logic data such as a heart rate or a blood pressure from a wearable device used by the user A and learns the sound level manipulation in association with the collected bio logic data. Next, the delivery server 10 may determine the reproduction mode according to the sound level manipulation associated with the bio logic data collected from the user A at the time of acquiring the delivery request.

5-6. Reproduction Mode

In the above-described example, the delivery server 10 determines the sound level at the time of reproducing the audio contained in the content as the reproduction mode. However, the embodiment is not limited thereto. For example, the delivery server 10 may determine the reproduction mode such as fade-in where the sound level is gradually changed. As more specific example, in a case where the sound level manipulation specified from the learning result is "mute setting", the delivery server 10 may determine the reproduction mode of reproducing the audio contained in the content in the mute state or determine the reproduction mode of reproducing the audio contained in the content in a form (that is, fade-in) where the sound level is gradually increased.

In addition, for example, in a case where the sound level manipulation specified from the learning result is "mute setting" and the to-be-delivered content is a content relating to advertisement, the delivery server 10 may determine the reproduction mode of reproducing the audio in a fade-in manner. By performing this process, the delivery server 10 can prevent the audio reproduction in such an inappropriate mode that the audio contained in the content is output abruptly at a high sound level, and as a result, the delivery server can allow the audio-containing content, which is intended to cause the user to listen to and watch, to be reproduced without impairing the user's mode.

In addition, if the delivery server 10 can output the audio in an appropriate mode, the delivery server may determine an arbitrary reproduction mode. For example, the delivery server 10 may determine the reproduction mode of increasing the sound level step by step. In addition, the delivery server 10 may determine the reproduction mode of outputting the audio in a frequency range which is difficult to propagate to the periphery thereof at a predetermined sound level and, after that, gradually increasing the output frequency range at a predetermined sound level.

5-7. Determination Processes for Audio Types

In the above-described example, the delivery server 10 controls the mode of outputting the audio contained in the content at the time of content reproduction. However, the embodiment is not limited thereto. For example, in some cases, the audio contained in the content includes plural types of audios such as sound logo, background sound, effect sound, and narration. It is considered that the audio includes an audio which the entity of registration (for example, advertiser) performing registration of the content desires to allow the user to listen to, an audio which may not be allowed the user to listen to, and the like.

Therefore, in a case where a plurality of audios are included in the audio in the content, the delivery server 10 may determine the reproduction modes for the respective audios according to the types of the respective audios. For example, the delivery server 10 receives the registration of the audio contained in the content from the advertiser's terminal 110 for each type of the audio. As more specific example, the delivery server 10 receives the registration of the audio data including the sound log, the audio data including the background sound, and the audio data including the narration as the audio data which are to be reproduced at the same time of reproducing the video contained in the content.

In this case, the delivery server 10 determines the reproduction mode for each type of the received audio data. For example, as the reproduction mode at the time of reproducing the audio data including the sound logo, the delivery server 10 determines the reproduction mode of reproducing the audio data at a predetermined sound level (for example, sound level set by the user or the advertiser) irrespective of the learning result. In addition, the terminal device 100 determines the reproduction mode at the time of reproducing the audio data including the background sound according to the sound level manipulation associated with the condition at the time of content delivery. In addition, in a case where the sound level manipulation associated with the condition at the time of content delivery is "mute state", as the reproduction mode at the time of reproducing the audio data including the narration, the terminal device 100 determines the reproduction mode of reproducing the audio data in a fade-in manner or in a mute state.

In addition, the delivery server 10 may perform sound analysis on the registered audio to temporally cut out a range including the sound logo and may define the audio in the range as the audio data including the sound logo. In addition, the delivery server 10 may divide the audio into the narration and the background sound by using frequency characteristics or the like of sound and may generate the respective audio data.

In this manner, since the delivery server 10 determines the reproduction mode for each type of the audio, the delivery server can reproduce the audio contained in the content in more appropriate mode. In addition, the delivery server 10 may determine the reproduction mode of reproducing even the BGM or the sound log in a fade-in manner or in a mute state according to the type of content or the like.

5-8. Determination Process after Temporary Stoppage

In addition, in a case where the terminal device 100 temporarily stops the content reproduction, the delivery server 10 may control the audio in a reproduction mode which is determined again by the determination process or may control the audio reproduction according to the reproduction mode at the time of temporarily stopping the reproduction. For example, in a case where the content reproduction is temporarily stopped by the user's manipulation or automatic control according to the display position of the content, the delivery server 10 may newly determine the reproduction mode based on new log information acquired from the terminal device 100 and may perform control so that the audio is reproduced in the newly-determined reproduction mode at the time of restarting the content reproduction.

For example, the delivery server 10 may newly determine the reproduction mode according to the type of the content of which reproduction is temporarily stooped, the reproduction time interval until the content reproduction is temporarily stopped, the manipulation performed on the terminal device 100 after the content reproduction is temporarily stopped, the position of the terminal device 100, or the like. Next, in a case where the delivery server 10 newly determines the reproduction mode, the delivery server may transmit the reproduction instruction of allowing the audio contained in the content to be reproduced in the newly-determined reproduction mode to the terminal device 100 at the time of restarting the content reproduction. As a result, when the audio is output inside an electric train or the like and the user performs manipulation disconcertingly, the delivery server 10 can prevent the audio from being output in an inappropriate manner where the audio in the content is output repeatedly several times.

5-9. Learning Result

In addition, the above-described delivery server 10 generates the learning result which is learned based on the log information or the attribute information. However, the embodiment is not limited thereto. For example, the delivery server 10 may register a pre-defined learning result in the learning result database 16 and determine the reproduction mode according to the registered learning result. As a specific example, if the delivery server 10 receives the registration of the learning result in association of the condition "entrance into thicket gate" with the sound level manipulation "mute state" from the advertiser's terminal 110, the delivery server registers the received learning result as non-updatable information in the learning result database 16. In this case, when the delivery server 10 receives the delivery request, in a case where the user enters the ticket gate of the station by using the terminal device 100, the delivery server can set the reproduction mode for the audio contained in the content as the "mute state" irrespective of the learning result based on the log information.

6. Flow of Processes of Delivery Server 10

Figure 9:
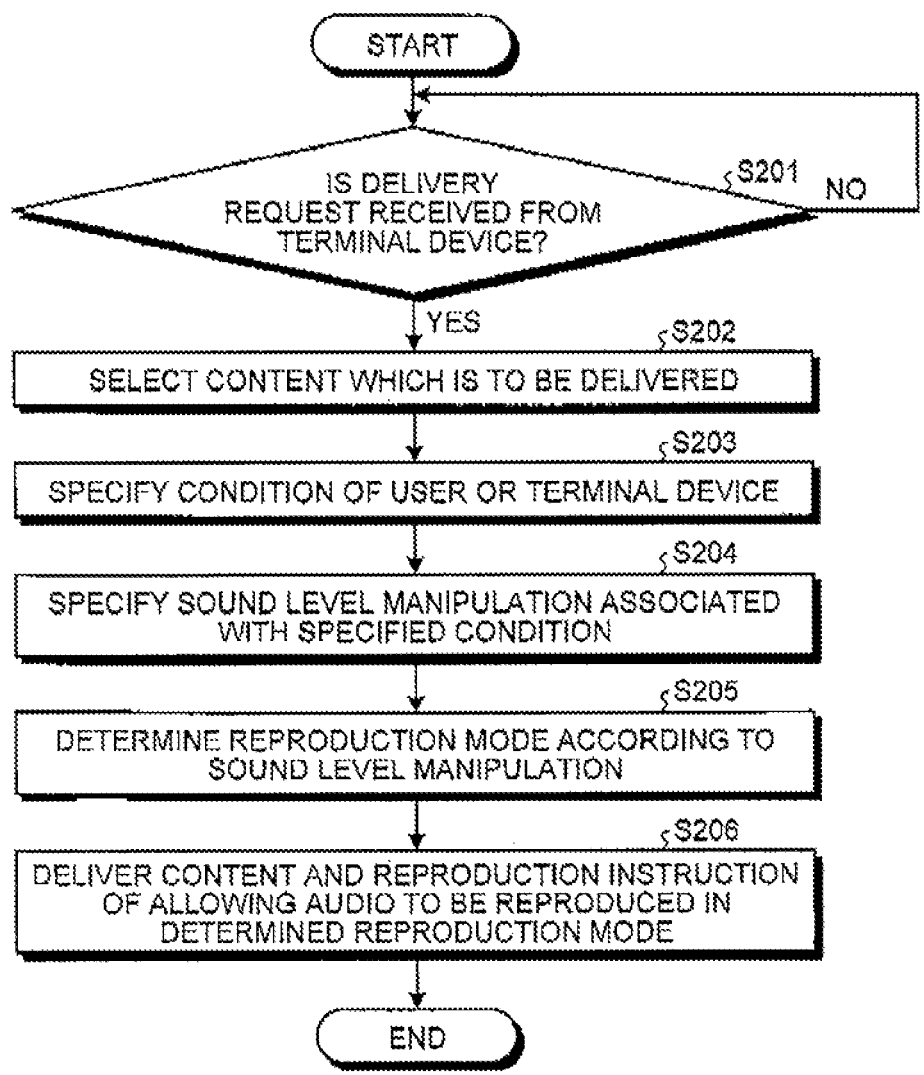
FIG. 9 is a flowchart illustrating an example of a determination process and a control process which are performed by the delivery server according to the embodiment.

Next, an example of a flow of the learning process, the determination process, and the control process performed by the delivery server 10 will be described with reference to FIGS. 8 and 9. First, the example of the learning process performed by the delivery server 10 will be described with reference to FIG. 8. FIG. 8 is a flowchart illustrating the example of the learning process performed by the delivery server according to the embodiment.

First, the delivery server 10 collects various types of the log information from the terminal device 100 or the like (step S101). Next, the delivery server 10 collects the attribute information of the user (step S102). Next, the delivery server 10 performs learning the sound level manipulation by using the log information and the attribute information (step S103), registers the learning result in the learning result database 16 (step S104), and ends the process.

Next, an example of a flow of the determination process and the control process performed by the delivery server 10 will be described with reference to FIG. 9. FIG. 9 is a flowchart illustrating the example of the determination process and the control process performed by the delivery server according to the embodiment.

First, the delivery server 10 determines whether or not the delivery request for the content is received from the terminal device 100 (step S201). In a case where the delivery server does not receive the delivery request (No in step S201), the delivery server performs step S201 again. Next, in the case were the delivery server 10 receives the delivery request for the content from the terminal device 100 (Yes in step S201), the delivery server selects the to-be-delivered content (step S202) and specifies the condition of the user and the terminal device 100 at the time of receiving the delivery request from the log information (step S203).

Next, the delivery server 10 specifies the sound level manipulation associated with the specified condition from the learning result (step S204). Subsequently, the delivery server 10 determines the reproduction mode according to the specified sound level manipulation (step S205). Next, the delivery server 10 delivers the content and the reproduction instruction of allowing the audio to be reproduced in the determined reproduction mode to the terminal device 100 (step S206) and ends the process.

7. Modified Example

The delivery server 10 according to the above-described embodiment may be embodied in various forms other than the above-described embodiment. Therefore, hereinafter, other embodiments of the delivery server 10 will be described.

7-1. Type of Content

The above-described delivery server 10 delivers the content relating to advertisement registered by the advertiser as the content. However, the embodiment is not limited thereto, but the delivery server 10 can employ the learning process, the determination process, and the control process for an arbitrary content. For example, besides the advertisement, the delivery server 10 can apply the above-described various processes on an arbitrary content such as a game or a web page of receiving the user's manipulation. As a more specific example, at the time of executing the game or at the time of delivering the web page in an interactive format generated by techniques of flash or CSS (cascading style sheets), the delivery server 10 may improve user's convenience by performing the above-described various processes.

In addition, at the time of reproducing a content containing only audios, the delivery server 10 may improve user's convenience by performing the above-described various processes.

7-2. Log

At the time of reproducing an actually-displayed content or a content in the reproduction mode determined by the determination process, the delivery server 10 may take the log of the user's manipulation. For example, at the time of reproducing the content in the reproduction mode determined by the determination process, the delivery server 10 acquires the log indicating whether or not the user performs the manipulation of changing the sound level and the log indicating the fact that the details of the manipulation is to change the audio. On the other hand, the delivery server 10 acquires the log indicating whether or not the content reproduction is performed, the reproduction time interval of the content, whether or not the content reproduction is temporarily stopped, the timing of the temporarily stopping, and the like.

The log acquired by the delivery server 10 in this manner becomes log useful for updating the CTR of each advertisement content, updating the number of impressions, reporting advertisement effects to the advertiser, and the like. In addition, the log acquired by the delivery server 10 may be used for changing the content which is arranged in the landing page set with respect to the to-be-delivered content. For example, in a case where the user selects the content, the delivery server 10 may notify the various types of the log to the server which delivers the landing page to perform delivering different landing pages according to the details of the log.

In addition, the delivery server 10 may determine the reproduction mode based on the history of the log. For example, the delivery server 10 learns the sound level manipulation for each content in association of the content with the details of the associated log, and if the delivery server receives the content delivery, the delivery server may determine the reproduction mode according to the sound level manipulation associated with the details of the log acquired within a predetermined time interval.

In addition, in the case where charging to the advertiser is performed in a click charging manner or an auction manner, the delivery server 10 may change the amount of charged fee to the advertiser based on the above-described log. For example, the delivery server 10 may install a difference between the amount of charged fee at the time of performing the above-described various processes and the amount of charged fee at the time of reproducing a predetermined sound level without performing the various processes.

7-3. Entities of Operations

In the above-described embodiment, the example where the delivery server 10 performs the learning process, the determination process, and the control process is described. However, the embodiment is not limited thereto. For example, the above-described learning, determination, and control processes may be performed by the terminal device 100. In addition, for example, the learning process may be performed by the delivery server 10, and the determination and control processes may be performed by the terminal device 100. For example, the terminal device 100 may perform the determination process by inquiring of the delivery server 10 about the learning result.

7-4. Configuration of Apparatus

In addition, in the above-described embodiment, the example where the delivery server 10 and the web server 120 are included is described. However, the delivery server 10 and the web server 120 may be formed as one apparatus. In addition, in the above-described embodiment, the example where the content is delivered from the delivery server 10 to the terminal device 100 is described. However, the embodiment is not limited thereto, but for example, the mode where a content delivery server which performs content delivery instead of the delivery server 10 delivers the content and the delivery server 10 delivers the reproduction instruction may be employed.

7-5. Record of Manipulation of Terminal Device

In addition, the above-described delivery server 10 may collect records as to how many times the user performs the manipulation on the terminal device 100 with respect to the web page where the content is arranged. More specifically, the delivery server 10 records scroll manipulation or the like performed by the user on the web page where the content is arranged.

In addition, the delivery server 10 may collect tapping manipulation (that is, selecting manipulation) on the content, the number of times of reloading the web page, transmitting manipulation (for example, writing in the SNS or the like) from the terminal device 100 with respect to the information specifying the content, and various types of manipulation performed by the user.

In this case, the delivery server 10 aggregates the information on the history of the collected manipulation to further acquire information obtained by analyzing the above information. For example, the delivery server 10 acquires information obtained by comparing the number of times of the scroll manipulation or the index of advertisement effect such as CTR with respect to the contents being involved with the above-described various processes and the contents not being involved with the various processes.

Herein, the history of the manipulation on the web page where the contents being involved with the above-described various processes are displayed may be an index indicating the advertisement effect. Namely, with respect to the web page where the contents being involved with the above-described various processes are displayed, as well as the display of the web page as a content destination by the user clicking the content itself, the manipulation history itself indicating how many times the user performs the scroll manipulation on the web page may be the index indicating the user's interest in the content.

For example, the delivery server 10 compares the number of times of the scroll manipulation performed by the user, the amount of the scroll manipulation, the time point or time interval of the scroll manipulation, whether or not a content is selected after the scroll manipulation, or the like to provide the index indicating how much the user is interested in the content at the time of displaying the content being involved with the above-described various processes. Therefore, the delivery server 10 can report the index of the advertisement effect with respect to the web page where the content is displayed according to the embodiment by transmitting the information on the manipulation history to the advertiser's terminal 110. In addition, the delivery server 10 may transmit the information on the manipulation history to the advertiser's terminal 110 without any change thereof.

Accordingly, the delivery server 10 can represent the usefulness of the process of widely notifying the content relating to advertisement by using the above-described various processes.

7-6. Others

The above-described delivery server 10 learns the sound level manipulation in the terminal device 100 based on the information on the user A and determines the reproduction mode at the time when the terminal device 100 reproduces the audio contained in the content according to the learning result. However, the embodiment is not limited thereto. For example, the delivery server 10 may perform only the determination and control processes by using a model of a learning result generated by a different server or the like. Namely, the delivery server 10 specifies the sound level manipulation corresponding to the situation of the user A at the time of delivery request for the content by using a model of the sound level manipulation relating to the sound level of the terminal device 100 which is learned based on the information on the user A and determines the reproduction mode according to the specified sound level manipulation.

Next, the delivery server 10 may control the audio contained in the content in the determined reproduction mode.

For example, a learning server (not shown) acquires the attribute information or the log information of the user A, learns the sound level manipulation in the terminal device 100 by using the acquired attribute information or the acquired log information, and transmits the learning result as a model to the delivery server 10. More specifically, the learning server learns the sound level manipulation in the terminal device 100 in association with the situation of the user A from the acquired attribute information or the acquired log information and produces the model in association of the situation of the user A with the sound level manipulation. Next, the learning server transmits the produced model to the delivery server 10.

On the other hand, if the delivery server 10 receives the delivery request from the terminal device 100, the delivery server specifies the situation of the user A from the log information and the like. In addition, the delivery server 10 specifies the sound level manipulation corresponding to the situation of the user A by applying the specified situation of the user A to the model. Next, the delivery server 10 determines the reproduction mode according to the specified sound level manipulation. After that, the delivery server 10 controls the audio contained in the content in the determined reproduction mode. In addition, the determination and control processes are implemented, for example, by the determination unit 21 and the audio controller 22 illustrated in FIG. 3.

In addition, the above-described processes may be implemented by not the delivery server 10 but the terminal device 100. Namely, the terminal device 100 acquires the learning result produced by the learning server or the delivery server 10 as the model. In addition, at the time of transmitting the delivery request, the terminal device 100 specifies the situation of the user A based on the physical situation or the like of the terminal device 100 by a predetermined method. Next, the terminal device 100 specifies the sound level manipulation corresponding to the situation of the user A from the acquired model and determines the reproduction mode according to the specified sound level manipulation. After that, the terminal device 100 may reproduce the audio contained in the content in the determined reproduction mode.

Herein, the model used by the delivery server 10 may include a model which is set in advance by the user A, the advertiser, the service provider which provides the service supplied by the delivery server 10, or the like. For example, the model used by the delivery server 10 may be in correspondence to the history of entrance into the ticket gate of the station and the reproduction mode of reproducing the audio in a mute state or in a fade-in manner in advance. In the case of using the model, in a case where the log information "function: entrance into thicket gate" is acquired within a predetermined time interval after the time of receiving the delivery request, the delivery server 10 may determine the reproduction mode of reproducing the audio in a mute state or in a fade-in manner.

7-7. Others

In addition, among the processes described in the embodiments, a portion of or all of the processes which are described to be automatically performed may be manually performed, and a portion of or all of the processes which are described to be manually performed may be automatically performed by using well-known methods. Besides, information including process procedures, specific names, various data, or various parameters described in the document or illustrated in the drawings may be arbitrarily changed if there is no particular description. For example, various types of information illustrated in each figure are not limited to the illustrated information.

In addition, each component of each device illustrated is functionally conceptual one, and each component is not necessarily configured with physical one as illustrated. Namely, a specific form of distribution or integration of each device is not limited to the described one, but each device may be configured by functionally or physically distributing or integrating a portion of or all of the components according to various loads or use situation. For example, the determination unit 21 and the audio controller 22 illustrated in FIG. 3 may be integrated.

In addition, the above-described embodiments may be appropriately combined within the scope where the details of the processes are not inconsistent with each other.

7-8. Program

Figure 10:
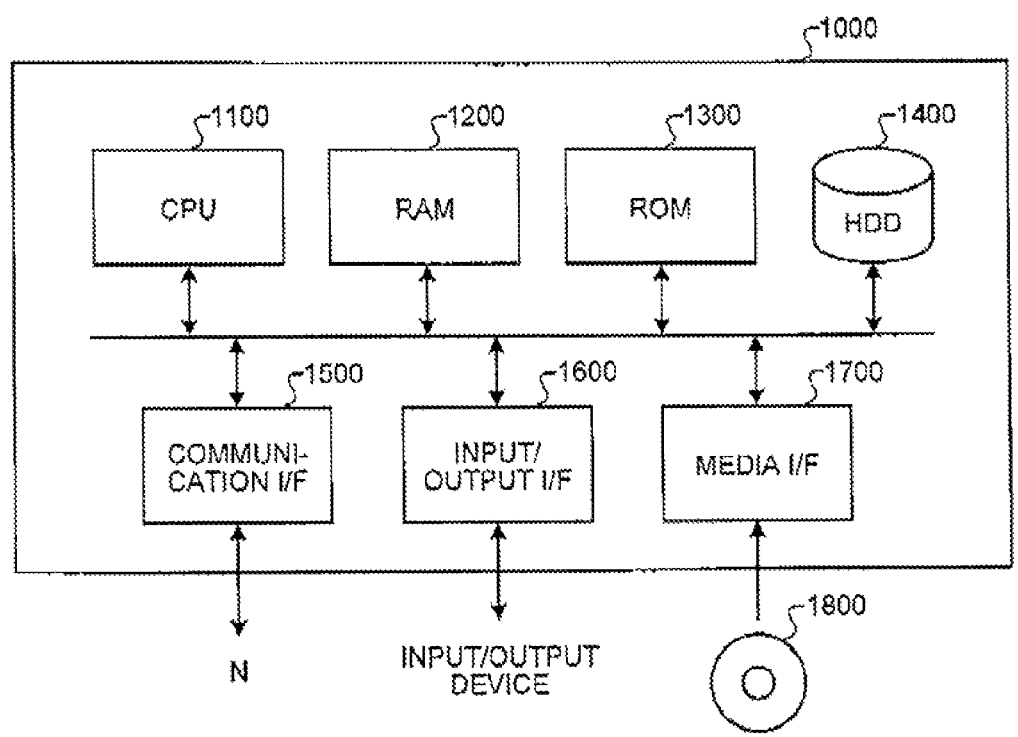
FIG. 10 is a hardware configuration diagram illustrating an example of a computer embodying functions of a delivery server.

In addition, the delivery server 10 according to the above-described embodiment is embodied, for example, by a computer 1000 having a configuration illustrated in FIG. 10. Hereinafter, the description is made by exemplifying the delivery server 10. FIG. 10 is a hardware configuration diagram illustrating the example of the computer embodying the functions of the delivery server. The computer 1000 includes a CPU 1100, a RAM 1200, a ROM 1300, an HDD 1400, a communication interface (I/F) 1500, an input/output interface (I/F) 1600, and a media interface (I/F) 1700.

The CPU 1100 controls each component by operating based on a program stored in the ROM 1300 or the HDD 1400. The ROM 1300 stores a boot program executed by the CPU 1100 at the time of starting up the computer 1000, programs depending on the hardware of the computer 1000, and the like.

The HDD 1400 stores programs executed by the CPU 1100, data used by the associated programs, and the like. The communication interface 1500 receives data from different apparatuses through the network N and transmits the data to the CPU 1100, and the communication interface transmits data generated by the CPU 1100 to different apparatuses.

The CPU 1100 controls an output device such as a display or a printer and an input device such as a keyboard or a mouse through the input/output interface 1600. The CPU 1100 acquires data from the input device through the input/output interface 1600. In addition, the CPU 1100 outputs the generated data to the output device through the input/output interface 1600.

The media interface 1700 reads out the program or data stored in a recording medium 1800 and supplies the program or data to the CPU 1100 through the RAM 1200. The CPU 1100 loads the associated program on the RAM 1200 from the recording medium 1800 through the media interface 1700 and executes the loaded program. The recording medium 1800 is, for example, an optical recording medium such as a DVD (digital versatile disc) or a PD (phase change rewritable disk), an optical magnetic recording medium such as an MO (magneto-optical disk), a tape medium, a magnetic recording medium, a semiconductor memory, or the like.

For example, in a case where the computer 1000 functions as the delivery server 10 according to the embodiment, the CPU 1100 of the computer 1000 embodies the functions of the controller 13 by executing the program loaded on the RAM 1200. In addition, the HDD 1400 stores the data in the storage unit 12, namely, the log information database 14, the attribute information database 15, the learning result database 16, and the delivery information database 17. Although the CPU 1100 of the computer 1000 reads out the program from the recording medium 1800 to execute the program, as another example, the CPU may acquire such a program from other devices.

In addition, in a case where the computer 1000 functions as the terminal device 100 according to the embodiment, the CPU 1100 of the computer 1000 may embody the same functions as the controller 13 by executing the program loaded on the RAM 1200 and allow the terminal device 100 to execute the above-described learning, determination, and control processes. In addition, the HDD 1400 stores the same data as the storage unit 12.

8. Effects

As described above, the delivery server 10 learns the sound level manipulation associated with the sound level of the terminal device 100 used by the user A based on the information on the user A. In addition, the delivery server 10 determines the reproduction mode at the time when the terminal device 100 reproduces the audio contained in the content according to the learning result of the learning process. Next, the delivery server 10 controls the audio contained in the content in the determined reproduction mode. Therefore, since the delivery server 10 can output the audio in the mode which the user A desires although the user A does not perform the sound level manipulation, the delivery server can improve user's convenience.

In particular, the delivery server 10 is optimized to an inside-article advertisement where an audio-containing advertisement content is displayed in a web page (that is, an article) which does not output an audio as a rule like a news site or the like. For example, it is considered that the user estimates that an audio is not output when the user browses articles in the news site or the like. However, as increased is the mode of delivering an audio-containing content such as a video content as an advertisement content, when the user browses article or the like, there is estimated a situation where an audio is output unexpectedly. On the other hand, since the delivery server 10 performs control so that the audio in the content delivered as the inside-article advertisement is reproduced in a determined reproduction mode, for example, in a case where the reproduction mode is determined by considering that the user browses articles under the assumption that the user does not listen to the audio, the delivery server can prevent the audio from being reproduced in an inappropriate mode.

In addition, the delivery server 10 is useful at the time of receiving delivery of advertisement content, video content, or the like under the assumption that the user listens to the audio like a delivery site for videos posted by the user and a delivery site of delivering paid or free-of-charge video content or the like.

In addition, the delivery server 10 learns the sound level manipulation associated with the situation of the terminal device 100 and determines the reproduction mode according to the sound level manipulation associated with the situation of the terminal device 100 at the time when the terminal device 100 acquires the content. Therefore, since the delivery server 10 can determine the reproduction mode according to the sound level manipulation based on the state of the terminal device 100 such as a slope or a manipulation history, the delivery server can improve user's convenience.

In addition, the delivery server 10 learns the sound level manipulation in association with the history of manipulation on the terminal device 100 and determines the reproduction mode according to the sound level manipulation associated with the manipulation performed at the time when the terminal device 100 acquires the content. Namely, the delivery server 10 learns the sound level manipulation according to the pattern of the history of manipulation on the terminal device 100 and determines the reproduction mode according to the sound level manipulation corresponding to the pattern of the manipulation history at the time of content delivery. Therefore, for example, since the delivery server 10 can appropriately determine the reproduction mode for the audio after various types of manipulation although the user A does not perform the sound level manipulation, the delivery server can improve user's convenience.

In addition, the delivery server 10 learns the sound level manipulation in association with the position of the terminal device 100 and determines the reproduction mode according to the sound level manipulation associated with the position at the time when the terminal device 100 acquires the content. Therefore, for example, since the delivery server 10 can determine the reproduction mode where the audio is in a mute state in a case where the terminal device 100 is located at an office or the like and the audio is output in a case where the terminal device 100 is located at home or the like of the user A although the user A does not perform the sound level manipulation, the delivery server can improve user's convenience.

In addition, the delivery server 10 learns the sound level manipulation in association with the network which the terminal device 100 accesses and determines the reproduction mode according to the sound level manipulation associated with the network which the terminal device 100 accesses at the time when the terminal device acquires the content. Therefore, for example, since the delivery server 10 can determine the reproduction mode where the audio is in the mute state in a case where the terminal device 100 accesses a public network of an office or the like and the audio is output in a case where the terminal device 100 accesses a private network of home or the like of the user A although the user A does not perform the sound level manipulation, the delivery server can improve user's convenience.

In addition, the delivery server 10 learns the sound level manipulation in association with the type of the content reproduced by the terminal device 100 and determines the reproduction mode at the time when the terminal device reproduces the audio contained in the content according to the sound level manipulation associated with the type of the content delivered to the terminal device 100. Therefore, for example, since the delivery server 10 can determine the reproduction mode at the time of reproducing the audio in the content according to whether or not the to-be-delivered content is a content relating to advertisement or whether or not the content is a video posted by a different user although the user A does not perform the sound level manipulation, the delivery server can improve user's convenience.

In addition, the delivery server 10 learns the sound level manipulation in association with the type of the display content which the terminal device 100 displays separately from the content and determines the reproduction mode according to the sound level manipulation associated with the type of the display content which the terminal device 100 displays separately from the content at the time when the terminal device 100 acquires the content. Therefore, for example, since the delivery server 10 can determine the reproduction mode where the audio in the content is output in a case where the terminal device 100 displays the web page relating to sports and the audio is in the mute state in a case where the terminal device 100 displays the web page relating to news although the user A does not perform the sound level manipulation, the delivery server can improve user's convenience.

In addition, the delivery server 10 learns the sound level manipulation in association with the physical state of the terminal device 100 and determines the reproduction mode according to the sound level manipulation associated with the physical state of the terminal device 100 at the time when the terminal device 100 acquires the content. Therefore, for example, since the delivery server 10 can determine the reproduction mode where the audio in the content is in the mute state in a case where the user A manipulates the terminal device 100 while standing in an electric train or the like and the audio is output in a case where the user A manipulates the terminal device 100 in a lying posture although the user A does not perform the sound level manipulation, the delivery server can improve user's convenience.

In addition, the delivery server 10 learns the sound level manipulation in association with the sound level of the different terminal device existing in the periphery of the terminal device 100 and determines the reproduction mode according to the sound level manipulation associated with the sound level of the different terminal device existing in the periphery of the terminal device 100 at the time when the terminal device 100 acquires the content. Therefore, for example, since the delivery server 10 can determine the reproduction mode where the audio in the content is output in a case where the different terminal device in the periphery of the terminal device 100 outputs the audio and the audio is in the mute state in a case where the different terminal device does not output the audio although the user A does not perform the sound level manipulation, the delivery server can improve user's convenience.

In addition, the delivery server 10 learns the sound level manipulation in association with the history of entrance and exit using the terminal device 100 and determines the reproduction mode according to the sound level manipulation associated with the history of entrance and exit at the time when the terminal device 100 acquires the content. Therefore, for example, since the delivery server 10 can determine the reproduction mode where the audio in the content is in the mute state in a case where the user enters the ticket gate of the station or into a building such as an office and the audio is output in a case where the user exits the ticket gate of the station or from the building although the user A does not perform the sound level manipulation, the delivery server can improve user's convenience.

In addition, in a case where a plurality of audios are contained in the content, the delivery server 10 determines the reproduction modes for the respective audios according to types of the respective audios. Therefore, the delivery server 10 can reproduce the audios contained in the content in appropriate modes.

In addition, in a case where the type of the audio contained in the content is sound logo, the delivery server 10 determines, as the reproduction mode, a mode of reproducing the sound logo at a predetermined sound level. Therefore, the delivery server 10 can allow the user to listen to the sound log contained in the content.

In addition, in a case where the type of the audio contained in the content is background sound, the delivery server 10 determines the reproduction mode according to the learning result. Herein, it is considered that the background sound is not an audio which draws too much attention of peripheral persons in comparison with sound logo or narration. Therefore, the delivery server 10 can prevent the audio from being reproduced in an inappropriate mode and can provide a chance to change the sound level to the user.

In addition, in a case where the type of the audio contained in the content is narration, the delivery server 10 determines, as the reproduction mode, a mode of reproducing the audio in the mute state or a mode of gradually increasing the sound level. Herein, it is considered that the narration is an audio which draws too much attention of peripheral persons in comparison with sound logo or background sound. Therefore, the delivery server 10 can prevent the audio from being reproduced in an inappropriate mode and can provide a chance to change the sound level to the user.

In addition, the delivery server 10 specifies the sound level manipulation corresponding to the situation of the user A at the time of the delivery request for the content from the model of the sound level manipulation relating to the sound level of the terminal device 100 learned based on the information on the user A and determines the reproduction mode according to the specified sound level manipulation. Next, the delivery server 10 controls the audio contained in the content in the determined reproduction mode. Therefore, since the delivery server 10 can output the audio in the mode which the user A desires although the user A does not perform the sound level manipulation, the delivery server can improve user's convenience.

Heretofore, the embodiments of the invention are described in detail with reference to the drawings, but these are exemplary ones. The invention can be embodied in various modifications or reforms based on knowledge of the ordinarily skilled in the art from the disclosure in the summary of the invention.

In addition, the above-described "units (sections, modules, units)" can be read as "means", "circuits", or the like. For example, the determination unit can be read as determination means or a determination circuit.

According to an embodiment, it is possible to obtain an effect in that user's convenience is improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An information processing apparatus comprising:
 a processor programmed to:
 learn sound level manipulation relating to a sound level of a terminal device used by a user based on information relating to a state of the user specified by: (i) terminal device log information, and (ii) user attribute information including at least demographic information of the user;
 determine a reproduction mode at a time when the terminal device reproduces an audio contained in a content according to a learning result; and
 control an audio contained in the content in the determined reproduction mode.

2. The information processing apparatus according to claim 1, wherein the processor is programmed to:
 learn the sound level manipulation in association with a situation of the terminal device; and
 determine the reproduction mode according to the sound level manipulation associated with the situation of the terminal device at the time when the terminal device acquires the content.

3. The information processing apparatus according to claim 1, wherein the processor is programmed to:
learn the sound level manipulation in association with a history of manipulation on the terminal device; and
determine the reproduction mode according to the sound level manipulation associated with the manipulation performed at the time when the terminal device acquires the content.

4. The information processing apparatus according to claim 1, wherein the processor is programmed to:
learn the sound level manipulation in association with a position of the terminal device; and
determine the reproduction mode according to the sound level manipulation associated with the position at the time when the terminal device acquires the content.

5. The information processing apparatus according to claim 1, wherein the processor is programmed to:
learn the sound level manipulation in association with a network which the terminal device accesses; and
determine the reproduction mode according to the sound level manipulation associated with the network which the terminal device accesses at the time when the terminal device acquires the content.

6. The information processing apparatus according to claim 1, wherein the processor is programmed to:
learn the sound level manipulation in association with a type of the content which the terminal device reproduces; and
determine the reproduction mode at the time when the audio contained in the content is reproduced according to the sound level manipulation associated with the type of the content delivered to the terminal device.

7. The information processing apparatus according to claim 1, wherein the processor is programmed to:
learn the sound level manipulation in association with a type of a display content which the terminal device displays separately from the content; and
determine the reproduction mode according to the sound level manipulation associated with the type of the display content which the terminal device displays separately from the content at the time when the terminal device acquires the content.

8. The information processing apparatus according to claim 1, wherein the processor is programmed to:
learn the sound level manipulation in association with a physical state of the terminal device; and
determine the reproduction mode according to the sound level manipulation associated with the physical state of the terminal device at the time when the terminal device acquires the content.

9. The information processing apparatus according to claim 1, wherein the processor is programmed to:
learn the sound level manipulation in association with a sound level of a different terminal device existing in a periphery of the terminal device; and
determine the reproduction mode according to the sound level manipulation associated with the sound level of the different terminal device existing in the periphery of the terminal device at the time when the terminal device acquires the content.

10. The information processing apparatus according to claim 1, wherein the processor is programmed to:
learn the sound level manipulation in association with a history of entrance and exit using the terminal device; and
determine the reproduction mode according to the sound level manipulation associated with the history of the entrance and exit at the time when the terminal device acquires the content.

11. The information processing apparatus according to claim 1, wherein, in a case where a plurality of audios are contained in the content, the processor is programmed to determine the reproduction modes for the respective plurality of audios according to types of the respective plurality of audios.

12. The information processing apparatus according to claim 11, wherein, in a case where the type of the audio contained in the content is sound logo, the processor is programmed to determine a mode where the sound logo is reproduced in a predetermined sound level as the reproduction mode.

13. The information processing apparatus according to claim 11, wherein, in a case where the type of the audio contained in the content is background sound, the processor is programmed to determine the reproduction mode according to the learning result.

14. The information processing apparatus according to claim 11, wherein, in a case where the type of the audio contained in the content is narration, the processor is programmed to determine a mode where the narration is in a mute state or a mode where the sound level is gradually increased as the reproduction mode.

15. An information processing apparatus comprising:
a processor programmed to:
specify sound level manipulation corresponding to a situation of a user at a time of a delivery request for a content from a model of the sound level manipulation relating to a sound level of a terminal device used by the user which is learned based on information relating to a state of the user specified by: (i) terminal device log information, and (ii) user attribute information including at least demographic information of the user;
determine a reproduction mode at the time when the terminal device reproduces an audio contained in the content according to the specified sound level manipulation; and
control the audio contained in the content in the determined reproduction mode.

16. A control method performed by an information processing apparatus, the control method comprising:
learning sound level manipulation relating to a sound level of a terminal device used by a user based on information relating to a state of the user specified by: (i) terminal device log information, and (ii) user attribute information including at least demographic information of the user;
determining a reproduction mode at a time when the terminal device reproduces an audio contained in a content according to a learning result of the learning; and
controlling the audio contained in the content in the reproduction mode determined by the determining.

17. A non-transitory computer readable storage medium having stored therein a control program causing a computer to execute a process, the process comprising:
learning sound level manipulation relating to a sound level of a terminal device used by a user based on information relating to a state of the user specified by: (i) terminal device log information, and (ii) user attribute information including at least demographic information of the user;

determining a reproduction mode at a time when the terminal device reproduces an audio contained in a content according to a learning result of the learning; and controlling the audio contained in the content in the reproduction mode determined by the determining.

\* \* \* \* \*